(12) United States Patent  
Cheng et al.

(10) Patent No.: US 11,158,969 B2  
(45) Date of Patent: Oct. 26, 2021

(54) CONNECTORS FOR INTEGRATED CIRCUIT PACKAGES

(71) Applicant: Intel Corporation, Santa Clara, CA (US)

(72) Inventors: Feifei Cheng, Chandler, AZ (US); Emad Al-Momani, Portland, OR (US); Ahmet Durgun, Chandler, AZ (US); Kuang Liu, Queen Creek, AZ (US)

(73) Assignee: Intel Corporation, Santa Clara, CA (US)

( * ) Notice: Subject to any disclaimer, the term of this patent is extended or adjusted under 35 U.S.C. 154(b) by 704 days.

(21) Appl. No.: 15/916,678

(22) Filed: Mar. 9, 2018

(65) Prior Publication Data

US 2019/0044265 A1   Feb. 7, 2019

(51) Int. Cl.
| | |
|---|---|
| H01R 3/00 | (2006.01) |
| H01R 12/72 | (2011.01) |
| H05K 3/30 | (2006.01) |
| H05K 7/10 | (2006.01) |
| H01R 12/70 | (2011.01) |
| H01R 12/85 | (2011.01) |
| H01R 12/88 | (2011.01) |
| H01R 24/60 | (2011.01) |
| H01R 107/00 | (2006.01) |

(52) U.S. Cl.
CPC ....... *H01R 12/721* (2013.01); *H01R 12/7076* (2013.01); *H01R 12/85* (2013.01); *H05K 3/301* (2013.01); *H05K 7/1007* (2013.01); *H05K 7/1076* (2013.01); *H01R 12/88* (2013.01); *H01R 24/60* (2013.01); *H01R 2107/00* (2013.01)

(58) Field of Classification Search
CPC ............................ H01R 12/00; H01R 13/2435
USPC ...... 439/515, 660, 327, 630, 267, 369.1, 366
See application file for complete search history.

(56) References Cited

U.S. PATENT DOCUMENTS

| | | | | | |
|---|---|---|---|---|---|
| 4,468,073 | A | * | 8/1984 | Machcinski | ........... H01R 12/88 439/266 |
| 6,024,587 | A | * | 2/2000 | Garth | ................... H05K 1/0218 439/101 |
| 6,315,614 | B1 | * | 11/2001 | Hassanzadeh | ....... H05K 7/1431 439/159 |

OTHER PUBLICATIONS

"High Performance Conductive Elastomer Interconnects", http://rdis.com/application-notes/board-to-board/, 1 page, Accessed Jan. 10, 2018.

* cited by examiner

*Primary Examiner* — Phuong K Dinh

(57) ABSTRACT

Apparatuses, systems and methods associated with connector design for mating with integrated circuit packages are disclosed herein. In embodiments, a connector for mating with an integrated circuit (IC) package may include a housing with a recess to receive a portion of the IC package and a contact coupled to the housing and that extends into the recess. The contact may include a main body that extends from the housing into the recess and a curved portion that extends from an end of the main body, wherein the curved portion loops back and contacts the main body. Other embodiments may be described and/or claimed.

25 Claims, 23 Drawing Sheets

CONNECTORS FOR INTEGRATED CIRCUIT PACKAGES

TECHNICAL FIELD

The present disclosure relates to the field of electronic circuits. More particularly, the present disclosure relates to the edge connectors for mating with integrated circuit packages.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Legacy edge connectors are generally mated to integrated circuit (IC) packages through applying force to the connectors and/or IC packages to insert a portion of the IC packages into a recess of the connectors. As the portion of the IC package is inserted into the recess, the IC package may make contact with contacts of the connectors and apply a force to the contacts that may cause the contacts to be damaged. In order to avoid the damage, the contacts may include relatively long (such as greater than 1.3 millimeters) contact stubs. However, having these relatively long contact stubs may cause signal degradation of signals applied to the contacts.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
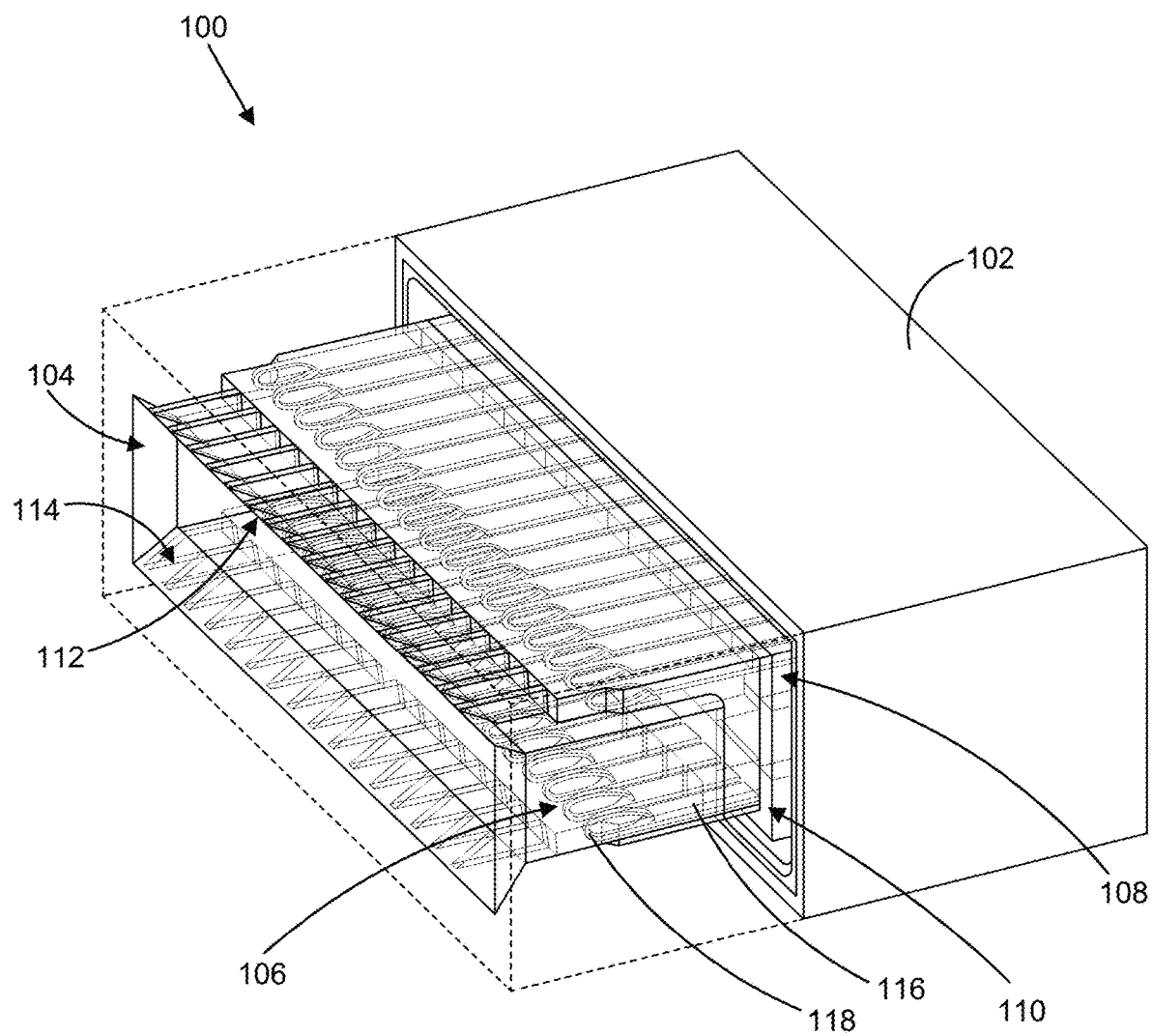
FIG. 1 illustrates an example connector with offset reversed contacts, according to various embodiments.

Apparatuses, systems and methods associated with connector design for mating with integrated circuit packages are disclosed herein. In embodiments, a connector for mating with an integrated circuit (IC) package may include a housing with a recess to receive a portion of the IC package and a contact coupled to the housing and that extends into the recess. The contact may include a main body that extends from the housing into the recess and a curved portion that extends from an end of the main body, wherein the curved portion loops back and contacts the main body.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates an example connector 100 with offset reversed contacts, according to various embodiments. The connector 100 may mate with an integrated circuit (IC) package. In particular, the connector 100 may comprise a high speed edge connector which may mate directly with a diving board (such as a host fabric interface (HFI) diving board) of an IC package (such as a central processing unit).

The connector 100 may include a housing 102. The housing 102 may have a recess 104. The recess 104 may receive the portion of the IC package. In particular, the portion of the IC package may be located within the recess 104 when the connector 100 is mated with the IC package.

The connector 100 may further include one or more contacts 106. In particular, the contacts 106 may comprise offset reverse contacts, as described further in relation to contact 200 of FIG. 2. The contacts 106 may couple to the housing 102 and may extend from the housing 102 into the recess 104. The contacts 106 may comprise a first row 108 of the contacts 106 and a second row 110 of the contacts 106. The first row 108 may extend in a row along a first side 112 of the recess 104 and the second row 110 may extend in a row along a second side 114 of the recess 104, wherein the first side 112 may be located on an opposite side of the recess 104 from the second side 114. The portion of the IC package may extend between the first row 108 of the contacts 106 and the second row 110 of the contacts 106 when the connector 100 is mated with the IC package. In particular, the contacts 106 of the first row 108 may contact pads on a first side of the portion of the IC package and the contacts 106 of the second row 110 may contact pads on a second side of the portion of the IC package when the connector 100 is mated with the IC package. In some embodiments, one of the first row 108 or the second row 110 may be omitted, such that a single row of the contacts 106 extends along one side of the recess 104.

Each of the contacts 106 may include a main body 116 and a curved portion 118. The main body 116 may extend from the housing 102 into the recess 104. The main body 116 may extend substantially (within five degrees) perpendicular from the housing 102. The curved portion 118 may be located at an opposite end of the main body 116 from the housing 102. The curved portion 118 may loop back toward where the main body 116 extends from the housing 102 and may contact a portion of the main body 116. In particular, loop back may refer to the curved portion 118 extending from an end of the main body 116 away from the main body 116 and curving back toward the main body 116. An end of the curved portion 118 that is looped back may contact the main body 116. The curved portion 118 that is looped back may form a hook shape, such as a closed hook shape with the end contacting the main body 116 in some embodiments. The end of the curved portion 118, that is located opposite from where the curved portion 118 extends from the main body 116, may contact a portion of the main body 116. The curved portion 118 may loop back away from the side of recess 104 along which each of the contacts 106 extend. For example, the contacts 106 within the first row 108 that extend along the first side 112 of the recess 104 may loop back toward the second side 114 of the recess 104. Further, the contacts 106 within the second row 110 that extend along the second side 114 of the recess 104 may loop back toward the first side 112 of the recess 104. A portion of the curved portion 118 of each of the contacts 106 may extend into the area where the portion of the IC package is to be received, such that the portion of the IC package may contact the curved portion 118 at it is received within the recess 104.

Figure 2:
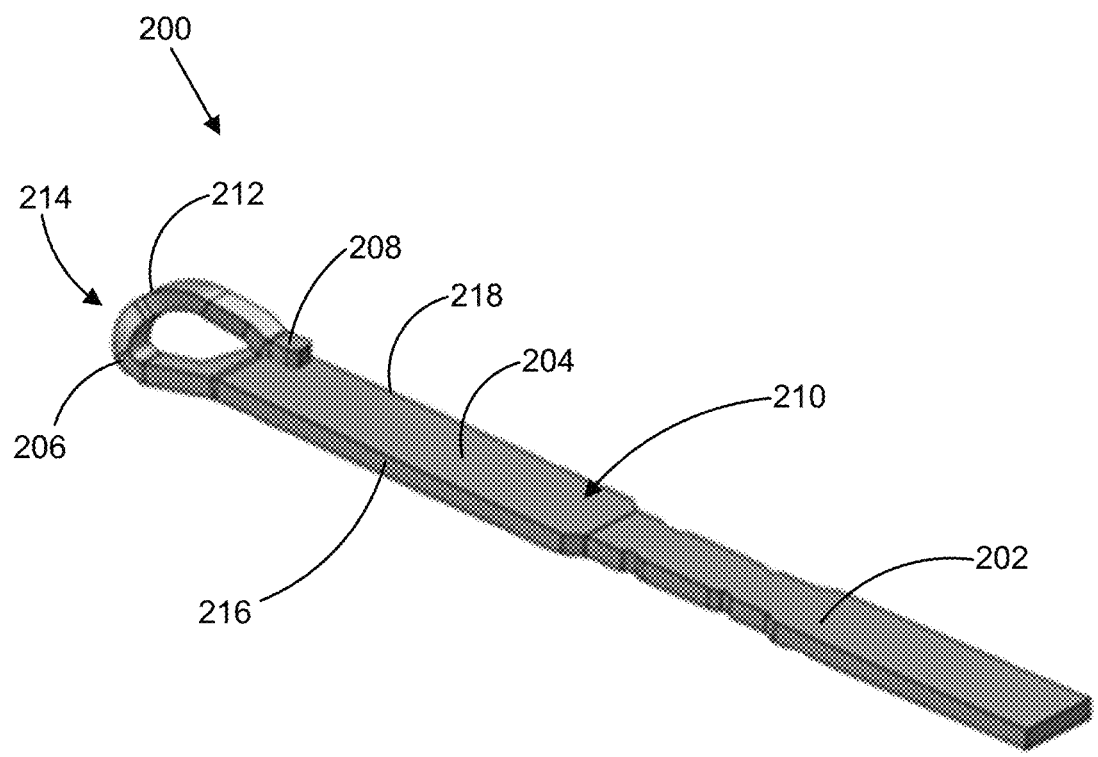
FIG. 2 illustrates an example contact, according to various embodiments.

FIG. 2 illustrates an example contact 200, according to various embodiments. The contact 200 may comprise an offset reverse contact. The contact 200 may be implemented in the connector 100 (FIG. 1). In particular, each of the contacts 106 (FIG. 1) of the connector 100 may comprise the contact 200. The contact 200 may be formed of an electrically-conductive material.

The contact 200 may include a mounting portion 202. The mounting portion 202 may extend into a housing (such as the housing 102 (FIG. 1)) and may couple the contact 200 to the housing. For example, the mounting portion 202 may be located within an aperture of the housing and may mount the contact 200 to the housing via friction between the mounting portion 202 and the housing. In some embodiments, the mounting portion 202 may further couple to the housing via epoxy and/or features of the housing that interact with the mounting portion 202.

The contact 200 may further include a main body 204. The main body 204 may be located at an end of the mounting portion 202 and may extend planar to the mounting portion 202. In some embodiments, the main body 204 may extend at an angle to the mounting portion 202. The main body 204 may extend from the housing into a recess (such as the recess 104 (FIG. 1)) when the contact 200 is coupled to the housing. For example, the main body 204 may extend at an angle from the housing.

Figure 5:
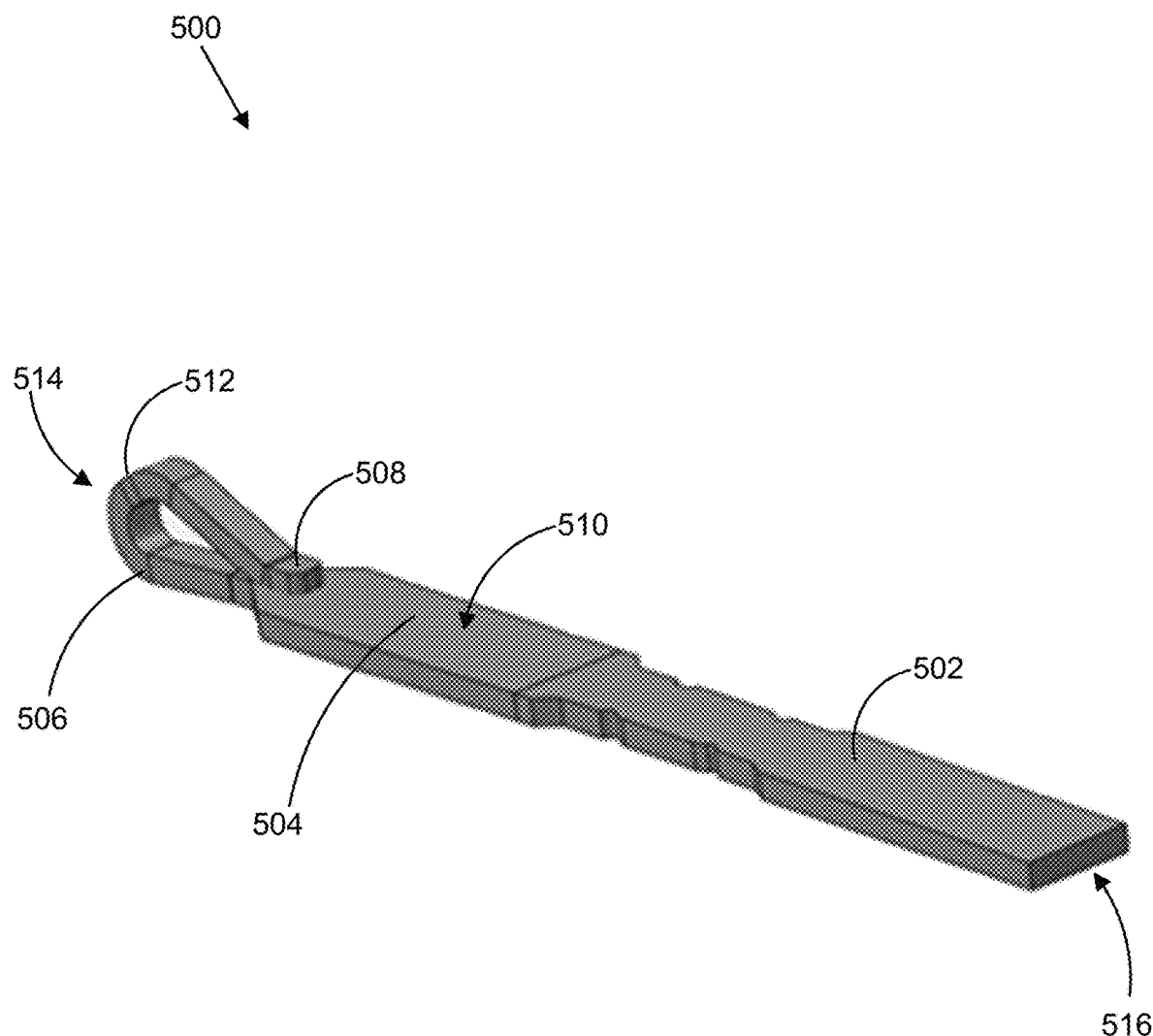
FIG. 5 illustrates another example contact, according to various embodiments.

The contact 200 may further include a curved portion 206. The curved portion 206 may be located at an opposite end of the main body 204 from the mounting portion 202. The curved portion 206 may extend from the main body 204. The curved portion 206 may extend at an angle from the main body 204. In other embodiments, the curved portion 206 may extend substantially (within five degrees) planar to the main body 204, such as shown in FIG. 5. When implemented in the connector 100, the curved portion 206 may contact a pad of the IC package and electrically couple the contact 200 to the pad when the connector 100 is mated with the IC package. The curved portion 206 may further extend from the main body 204 toward a first edge 216 of the contact 200 and loop back toward a second edge 218 of the contact 200.

The curved portion 206 may loop back and contact the main body 204. In particular, loop back may refer to the curved portion 206 extending from an end of the main body 204 away from the main body 204 and curving back toward the main body 204. An end 208 of the curved portion 206 that is looped back may contact the main body 204. The curved portion 206 that is looped back may form a hook shape, such as a closed hook shape with the end 208 contacting the main body 204 in some embodiments. The end 208 may be electrically coupled to the main body 204. In some embodiments, the end 208 may be affixed to the main body 204 via solder, an electrically-conductive epoxy, or some combination thereof. Further, in some embodiments, the end 208 may be clamped, or may have been clamped during production of the contact 200, against the main body 204, which may cause the end 208 to remain in contact with the main body 204.

A first side 210 of the contact 200 is shown. The first side 210 of the contact 200 may be directed toward a center of the recess when the contact 200 is coupled to the housing. Further, a second side (located opposite from the first side 210 illustrated) may be directed toward a side of the recess when the contact 200 is coupled to the housing. For example, when the contact 200 is implemented within the first row 108 (FIG. 1) of the connector 100, the second side of the contact 200 may be directed toward the first side 112 (FIG. 1) of the recess 104. When the contact 200 is implemented within the second row 110 (FIG. 1) of the connector 100, the second side of the contact 200 may be directed toward the second side 114 (FIG. 1) of the recess 104. Further, the curved portion 206 may loop back toward the center of the recess 104 when the contact 200 is implemented within either of the first row 108 or the second row 110.

The curved portion 206 may include a guide portion 212. The guide portion 212 may be located on the first side 210 of the contact 200 and may be located toward an end 214 of the contact 200. The guide portion 212 may extend from the end 214 of the contact 200 and slant back toward the main body 204. When implemented in the connector 100, the portion of the IC package may contact the guide portion 212 during mating of the connector 100 with the IC package and the guide portion 212 may guide the IC package between the first row 108 and the second row 110 during mating.

Figure 3:
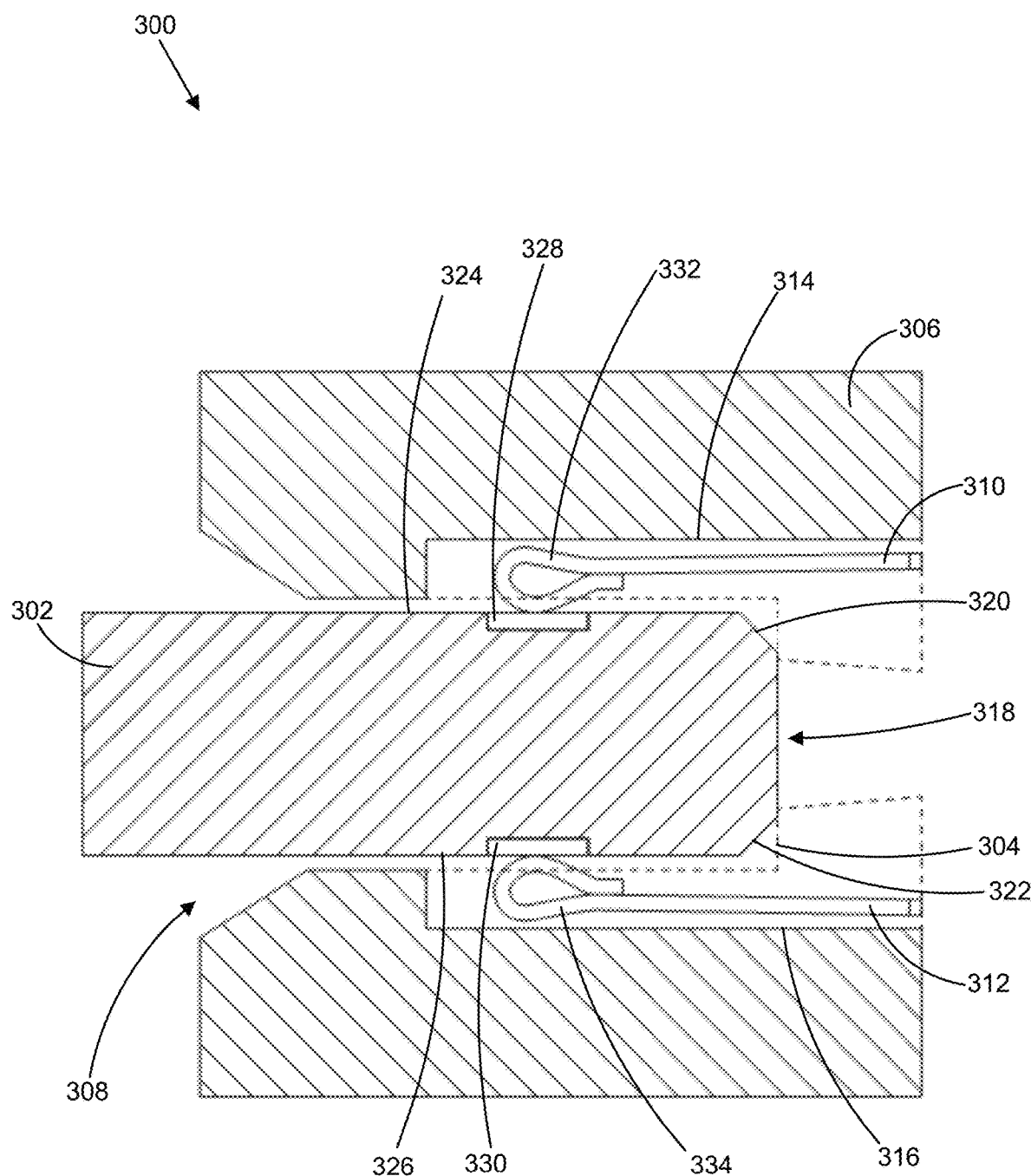
FIG. 3 illustrates a cross-sectional view of the example connector mated with an IC package, according to various embodiments.

FIG. 3 illustrates a cross-sectional view of the example connector 300 mated with an IC package 302, according to various embodiments. The connector 300 may include one or more of the features of the connector 100 (FIG. 1).

The connector 300 may include a housing 306 with a recess 308. A portion of the IC package 302 may be located within the recess 308. The portion of the IC package 302 may contact a back wall 304 of the housing 306 when the connector 300 is mated to the IC package 302, which may facilitate positioning of the portion of the IC package 302 within the connector 300. The connector 300 may include a first contact 310 and a second contact 312. Both the first contact 310 and the second contact 312 may include one or more of the features of the contacts 106 (FIG. 1) and/or the contact 200 (FIG. 2). The first contact 310 may extend along a first side 314 of the recess 308 and the second contact 312 may extend along a second side 316 of the recess 308.

The IC package 302 may extend between the first contact 310 and the second contact 312. The IC package 302 may include a beveled end 318 with a first slanted portion 320 and the second slanted portion 322. The first slanted portion 320 may contact the first contact 310 during insertion of the IC package 302 within recess 308, causing the first contact 310 to flex and press against a first side 324 of the IC package 302. Further, the second slanted portion 322 may contact the second contact 312 during insertion of the IC package 302 within the recess 308, causing the second contact 312 to flex and press against a second side 326 of the IC package 302.

The IC package 302 may include a first pad 328 and a second pad 330. The first pad 328 may be located at the first side 324 of the IC package 302 and the second pad 330 may be located at the second side 326 of the IC package 302. The first contact 310 may contact and press against the first pad 328 when the connector 300 is mated with the IC package 302, thereby electrically coupling the first contact 310 to the first pad 328. The second contact 312 may contact and press against the second pad 330 when the connector 300 is mated with the IC package 302, thereby electrically coupling the second contact 312 to the second pad 330. In particular, a curved portion 332 of the first contact 310 may contact the first pad 328 and a curved portion 334 of the second contact 312 may contact the second pad 330.

Figure 4:
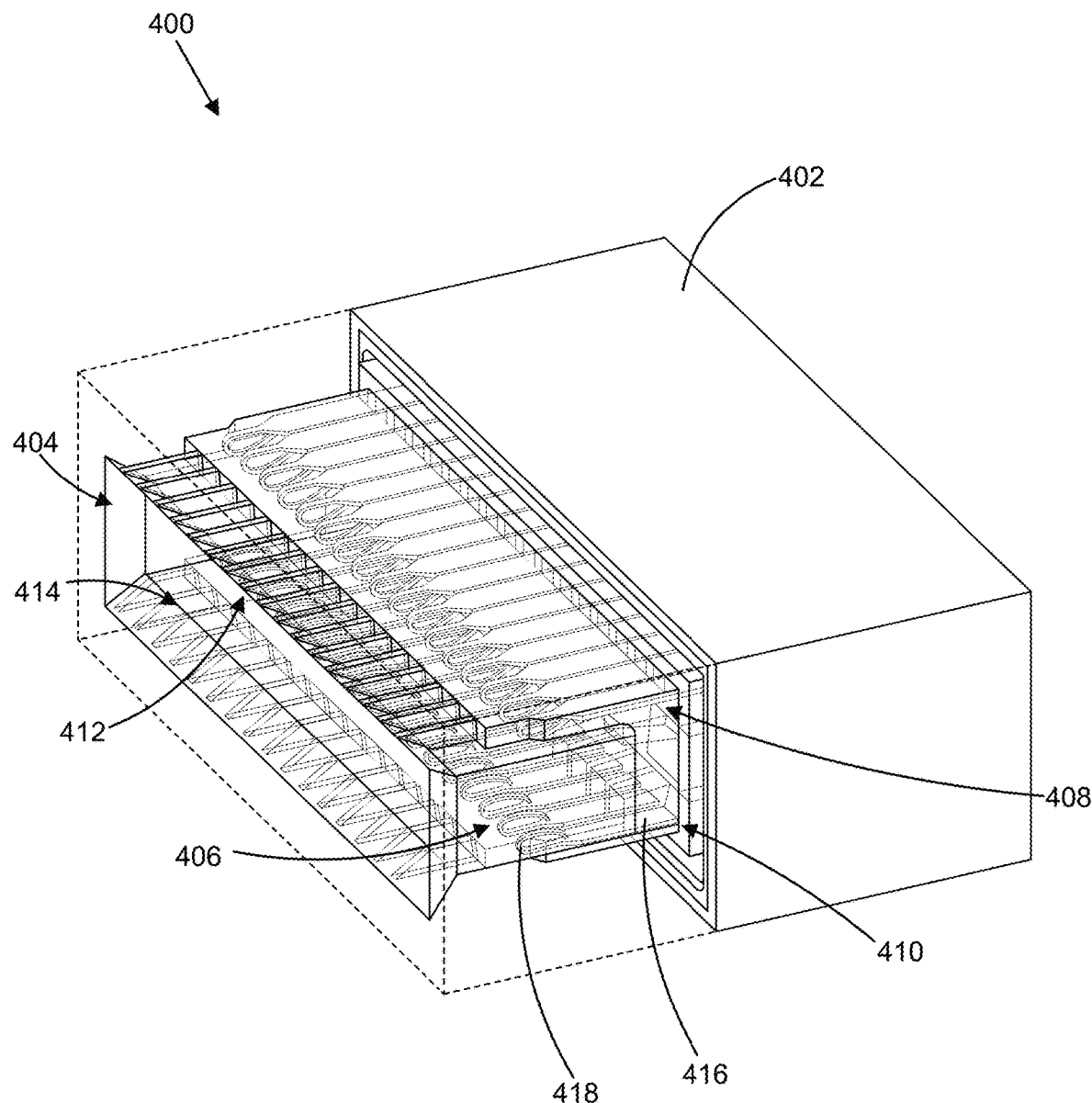
FIG. 4 illustrates another example connector, according to various embodiments.

FIG. 4 illustrates another example connector 400, according to various embodiments. The connector 400 may mate with an IC package. In particular, the connector 400 may comprise a high speed edge connector which may mate directly with a diving board (such as an HFI diving board) of an IC package (such as a central processing unit).

The connector 400 may include one or more of the features of the connector 100 (FIG. 1). In particular, the connector 400 may include a housing 402, which may include one or more of the features of the housing 102 (FIG. 1). The housing 402 may include a recess 404 to receive a portion of the IC package.

The connector 400 may further include one or more contacts 406. In particular, the contacts 406 may comprise non-offset reverse contacts, as described further in relation to contact 500 of FIG. 5. The contacts 406 may couple to the housing 402 and may extend from the housing 402 into the recess 404. The contacts 406 may comprise a first row 408 of the contacts 406 and a second row 410 of the contacts 406. The first row 408 may extend in a row along a first side 412 of the recess 404 and the second row 410 may extend in a row along a second side 414 of the recess 404, wherein the first side 412 may be located on an opposite side of the recess 404 from the second side 414. The portion of the IC package may extend between the first row 408 of the contacts 406 and the second row 410 of the contacts 406 when the connector 400 is mated with the IC package. In particular, the contacts 406 of the first row 408 may contact pads on a first side of the portion of the IC package and the contacts 406 of the second row 410 may contact pads on a second side of the portion of the IC package when the connector 400 is mated with the IC package. In some embodiments, one of the first row 408 or the second row 410 may be omitted, such that a single row of the contacts 406 extends along one side of the recess 404.

Each of the contacts 406 may include a main body 416 and a curved portion 418. The main body 416 may extend from the housing 402 into the recess 404. The main body 416 may extend substantially (within five degrees) perpendicularly from the housing 402. The curved portion 418 may be located at an opposite end of the main body 416 from the housing 402. The curved portion 418 may loop back toward where the main body 416 extends from the housing 402 and may contact a portion of the main body 416. In particular, loop back may refer to the curved portion 418 extending from an end of the main body 416 away from the main body 416 and curving back toward the main body 416. An end of the curved portion 418 that is looped back may contact the main body 416. The curved portion 418 that is looped back may form a hook shape, such as a closed hook shape with the end contacting the main body 416 in some embodiments. In particular, an end of the curved portion 418, that is located opposite from where the curved portion 418 extends from the main body 416, may contact a portion of the main body 416. The curved portion 418 may loop back away from the side of recess 404 along which each of the contacts 406 extend. For example, the contacts 406 within the first row 408 that extend along the first side 412 of the recess 404 may loop back toward the second side 414 of the recess 404. Further, the contacts 406 within the second row 410 that extend along the second side 414 of the recess 404 may loop back toward the first side 412 of the recess 404. A portion of the curved portion 418 of each of the contacts 406 may extend into the area where the portion of the IC package is to be received, such that the portion of the IC package may contact the curved portion 418 at it is received within the recess 404.

FIG. 5 illustrates another example contact 500, according to various embodiments. The contact 500 may comprise a non-offset reverse contact. The contact 500 may be implemented in the connector 400 (FIG. 4). In particular, each of the contacts 406 (FIG. 4) of the connector 400 may comprise a contact 500. The contact 500 may be formed of an electrically-conductive material.

The contact 500 may include a mounting portion 502. The mounting portion 502 may be located at a first end 516 of the contact 500. The mounting portion 502 may extend into a housing (such as the housing 402 (FIG. 4)) and may couple the contact 500 to the housing. For example, the mounting portion 502 may be located within an aperture of the housing and may mount the contact 500 to the housing via friction between the mounting portion 502 and the housing. In some embodiments, the mounting portion 502 may further couple to the housing via epoxy and/or features of the housing that interact with the mounting portion 502.

The contact 500 may further include a main body 504. The main body 504 may be located at an end of the mounting portion 502. In some embodiments, the main body 504 may extend planar to the mounting portion 502. The main body 504 may extend from the housing into a recess (such as the recess 404 (FIG. 4)) when the contact 500 is coupled to the housing. For example, the main body 504 may extend substantially (within five degrees) perpendicular from the housing.

The contact 500 may further include a curved portion 506. The curved portion 506 may be located at an opposite end of the main body 504 from the mounting portion 502. The curved portion 506 may extend from the main body 504. The curved portion 506 may extend substantially (within five degrees) planar from the main body 504. When implemented in the connector 400, the curved portion 506 may contact a pad of the IC package and electrically couple the contact 500 to the pad when the connector 400 is mated with the IC package. The curved portion 506 may further extend from the main body 504 and loop back along a plane.

The curved portion 506 may loop back and contact the main body 504. In particular, loop back may refer to the curved portion 506 extending from an end of the main body 504 away from the main body 504 and curving back toward the main body 504. An end 508 of the curved portion 506 that is looped back may contact the main body 504. The curved portion 506 that is looped back may form a hook shape, such as a closed hook shape with the end 508 contacting the main body 504 in some embodiments. The end 508 may be electrically coupled to the main body 504. In some embodiments, the end 508 may be affixed to the main body 504 via solder, an electrically-conductive epoxy, or some combination thereof. Further, in some embodiments, the end 508 may be clamped, or may have been clamped during production of the contact 500, against the main body 504, which may cause the end 508 to remain in contact with the main body 504.

A first side 510 of the contact 500 is shown. The first side 510 of the contact 500 may be directed toward a center of the recess when the contact 500 is coupled to the housing. Further, a second side (located opposite from the first side 510 illustrated) may be directed toward a side of the recess when the contact 500 is coupled to the housing. For example, when the contact 500 is implemented within the first row 408 (FIG. 4) of the connector 400, the second side of the contact 500 may be directed toward the first side 412 (FIG. 4) of the recess 404. When the contact 500 is implemented within the second row 410 (FIG. 4) of the connector 400, the second side of the contact 500 may be directed toward the second side 414 (FIG. 4) of the recess 404. Further, the curved portion 506 may loop back toward the center of the recess 404 when the contact 500 is implemented within either of the first row 408 or the second row 410.

The curved portion 506 may include a guide portion 512. The guide portion 512 may be located on the first side 510 of the contact 500 and may be located toward a second end 514 of the contact 500. The guide portion 512 may extend from the second end 514 of the contact 500 and slant back toward the main body 504. When implemented in the connector 400, the portion of the IC package may contact the guide portion 512 during mating of the connector 400 with the IC package and the guide portion 512 may guide the IC package between the first row 408 and the second row 410 during mating.

Figure 6:
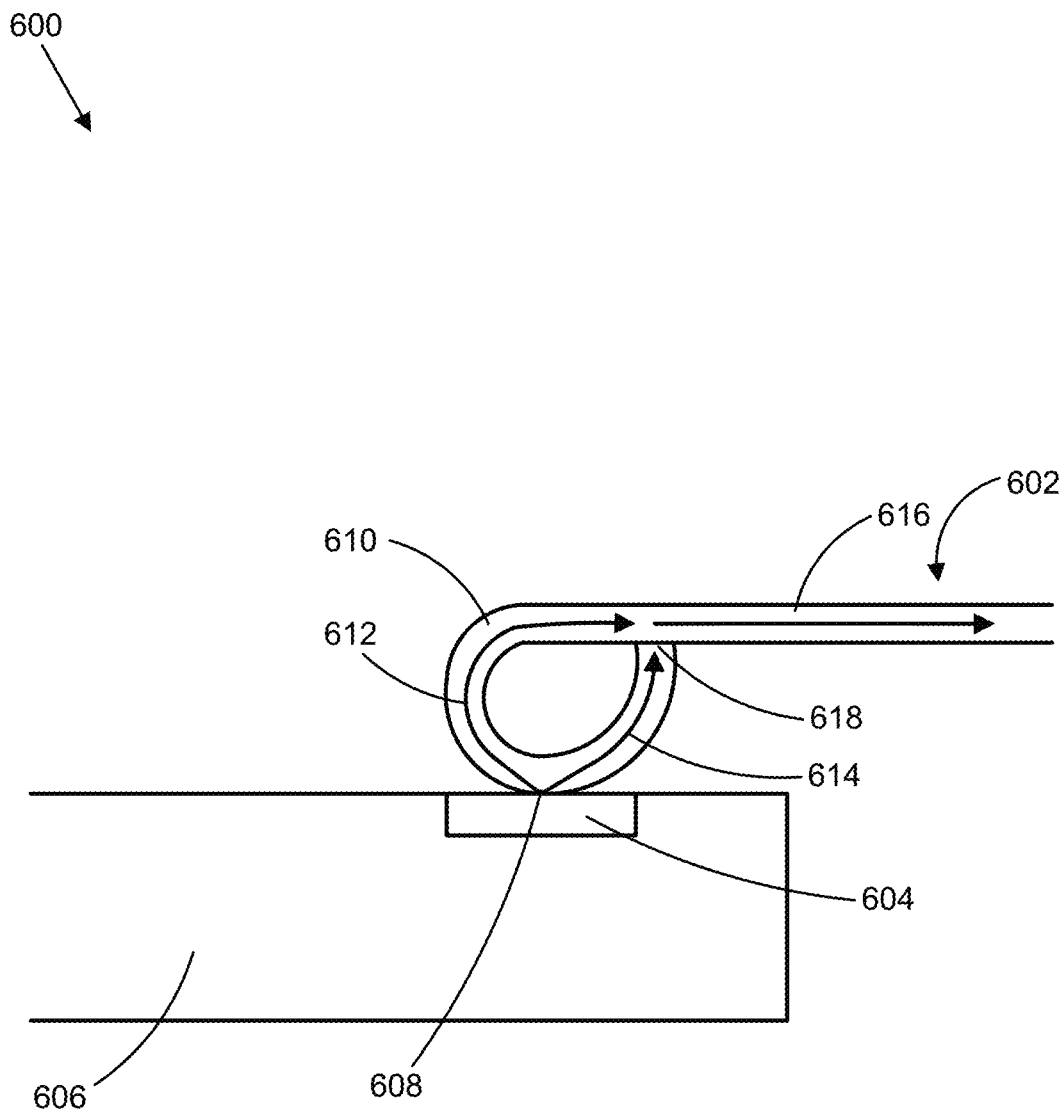
FIG. 6 illustrates an example diagram of current flow of a contact, according to various embodiments.

FIG. 6 illustrates a diagram 600 of an example current flow of a contact 602, according to various embodiments. In particular, the diagram 600 illustrates a possible current flow of an offset reverse contact (such as the contact 200 (FIG. 2)) and/or a non-offset reverse contact (such as the contact 500 (FIG. 5)). The diagram 600 illustrates a possible current flow from a pad 604 of an IC package 606 through the contact 602. The contact 602 may include one or more of the features of the contact 200 and/or the contact 500.

The contact 602 may contact the pad 604 at a contact point 608. Current may flow between the contact 602 and the pad 604 through the contact point 608. In the illustrated embodiment, the current is illustrated flowing from the pad 604 through the contact 602.

The current may flow from the contact point 608 through a curved portion 610 of the contact 602 along a first path 612 and a second path 614. In particular, a first portion of the current may flow along the first path 612 and a second portion of the current may flow along the second path 614. The first path 612 may originate at the contact point 608 and continue through a loop back of the curved portion 610 to a main body 616 of the contact 602. The second path 614 may originate at the contact point 608 and continue through an end 618 of the contact 602 to the main body 616, wherein the end 618 contacts the main body 616.

Having the first path 612 and the second path 614 of current flow may effectively eliminate, or at least reduce, signal degradation caused by contact stub effect. In particular, the contact 602 may have a stub length of effectively zero based on the current having the first path 612 and the second path 614 through which to flow.

Figure 7:
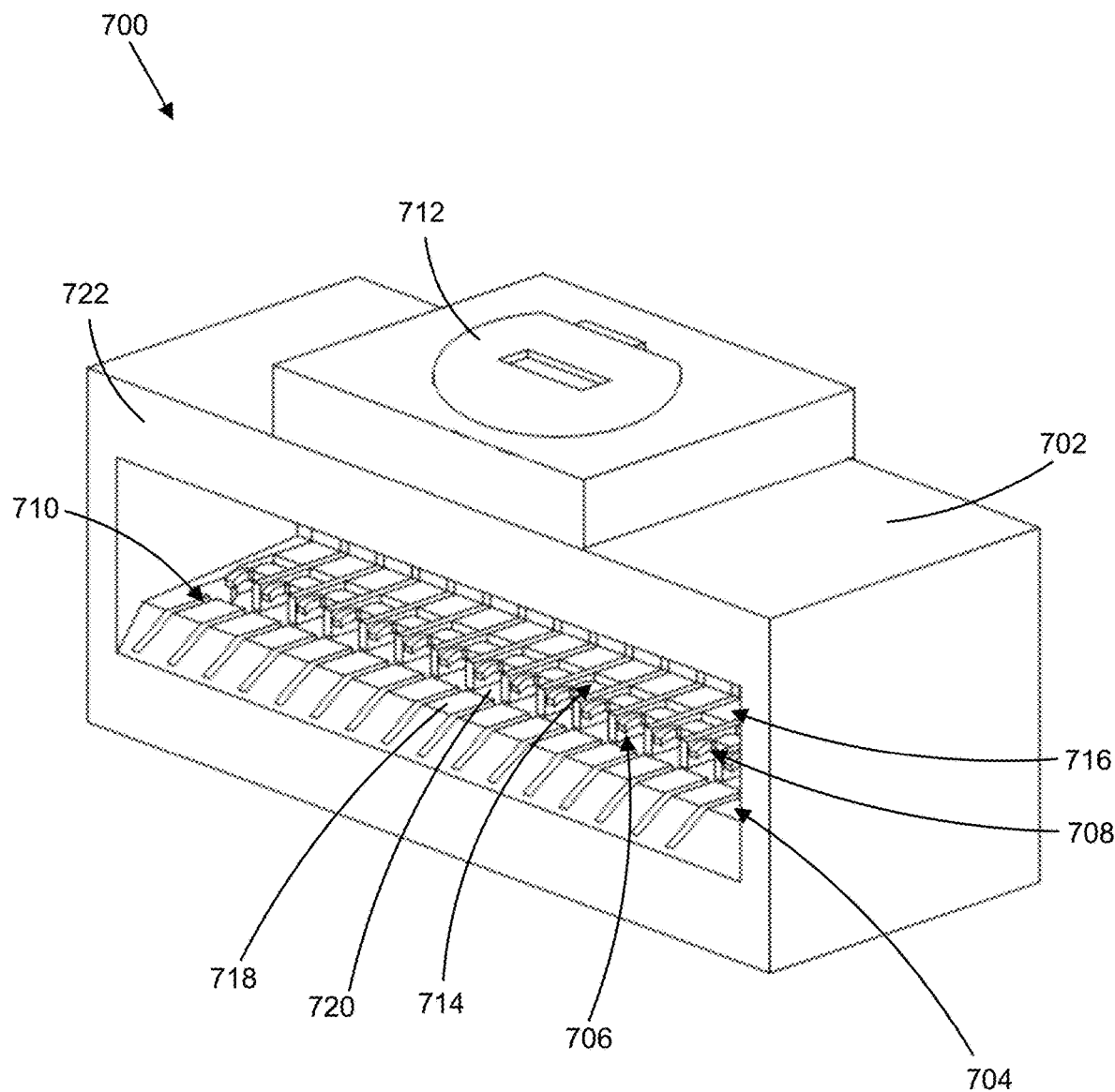
FIG. 7 illustrates an example connector with retraction mechanism, according to various embodiments.

FIG. 7 illustrates an example connector 700 with retraction mechanism, according to various embodiments. The connector 700 may include one or more of the features of the connector 100 (FIG. 1) and/or the connector 400 (FIG. 4). The connector 700 may mate with an integrated circuit (IC) package. In particular, the connector 700 may comprise a high speed edge connector which may mate directly with a diving board (such as an HFI diving board) of an IC package (such as a central processing unit).

The connector 700 may include a housing 702. The housing 702 may have a recess 704. The recess 704 may receive the portion of the IC package. In particular, the portion of the IC package may be located within the recess 704 when the connector 700 is mated with the IC package.

The connector 700 may further include one or more contacts 706. The contacts 706 may couple to the housing 702 and may extend from the housing 702 into the recess 704. The contacts 706 may comprise a first row 708 of the contacts 706. The first row 708 may extend in a row along a first side 710 of the recess 704. The contacts 706 may further include a second row of contacts 706, which are obscured due to the view point. The second row of contacts 706 may be a mirror image of the first row 708 of the contacts 706, mirrored about a center of the recess 704. In particular, the second row of contacts 706 may be a mirror image of the first row of contacts 706 and may be located along a second side of the recess 704 that is located opposite to the first side 710. The portion of the IC package may extend between the first row 708 of the contacts 706 and the second row of the contacts 706 when the connector 700 is mated with the IC package. In particular, the contacts 706 of the first row 708 may contact pads on a first side of the portion of the IC package and the contacts 706 of the second row may contact pads on a second side of the portion of the IC package when the connector 700 is mated with the IC package. In some embodiments, one of the first row 708 or the second row may be omitted, such that a single row of the contacts 706 extends along one side of the recess 704.

The connector 700 may further include a retraction mechanism. The retraction mechanism may include a cam mechanism 712. The cam mechanism 712 may be located at a surface of the housing 702. The cam mechanism 712 may control actuation of the retraction mechanism. For example, a user may activate the cam mechanism 712 (such as through rotation of a portion of the cam mechanism 712), which in turn may actuate the retraction mechanism.

The retraction mechanism may further include one or more pretension elements 714. The pretension elements 714 may comprise a first row 716 of the pretension elements 714 and a second row of the pretension elements 714. The first row 716 of the pretension elements 714 may be located adjacent to the contacts 706 within the first row 708. For example, a portion of each of the contacts 706 within the first row 708 may be located between the pretension elements 714 within the first row 716 and the first side 710 of the recess 704. The first row 716 of the pretension elements 714 may translate along the first side 710 of the recess 704 when the retraction mechanism is actuated. As the first row 716 of pretension elements 714 are translated, the pretension elements 714 within the first row 716 may contact the contacts 706 within the first row 708 and apply force to the contacts 706 that causes the contacts 706 to flex. As the contacts 706 are flexed, the contacts 706 may be moved away from a location where the portion of the IC package is to be received within the recess 704.

The housing 702 may include a first lip 718 located at the first side 710 of the recess 704. The recess 704 may further include a first cutout 720 located at the first side 710 of the recess 704. The first cutout 720 may be located adjacent to the first lip 718. In particular, the first cutout 720 may be located behind the first lip 718, opposite from a first side 722 of the housing 702 into which the recess 704 extends. As the contacts 706 within the first row 708 are flexed by the pretension elements 714, the contacts 706 may move behind the lip 718 and into the first cutout 720. When the contacts 706 are located behind the lip 718, the portion of the IC package may be inserted into, and/or removed from, the recess 704 without the portion of the IC package contacting the contacts 706 within the first row 716, or with the portion of IC package contacting a small portion of each of the contacts 706. The lack of contact with the contacts 706, or contact with the small portion of each of the contacts 706, may prevent, or at least reduce, possible damage to the contacts 706 that may occur during insertion and/or removal of the portion of the IC package.

The housing 702 may further include a second lip located at the second side of the recess 704. Further, the recess 704 may further include a second cutout located at the second side of the recess 704. The second lip, the second cutout, the second row of the contacts 706, and the second row of the pretension elements 714 may be a mirror image of the first lip 718, the first cutout 720, the first row 708 of the contacts 706, and the first row 716 of the pretension elements 714, mirrored about a center of the recess. In particular, the arrangement of the first lip 718, the first cutout 720, the first row 708 of the contacts 706, and the first row 716 of the pretension elements 714 located at the first side 710 of the recess 704 may be a mirror image of the second lip, the second cutout, the second row of the contacts 706, and the second row of the pretension elements 714, which are located at the second side of the recess 704.

Figure 8:
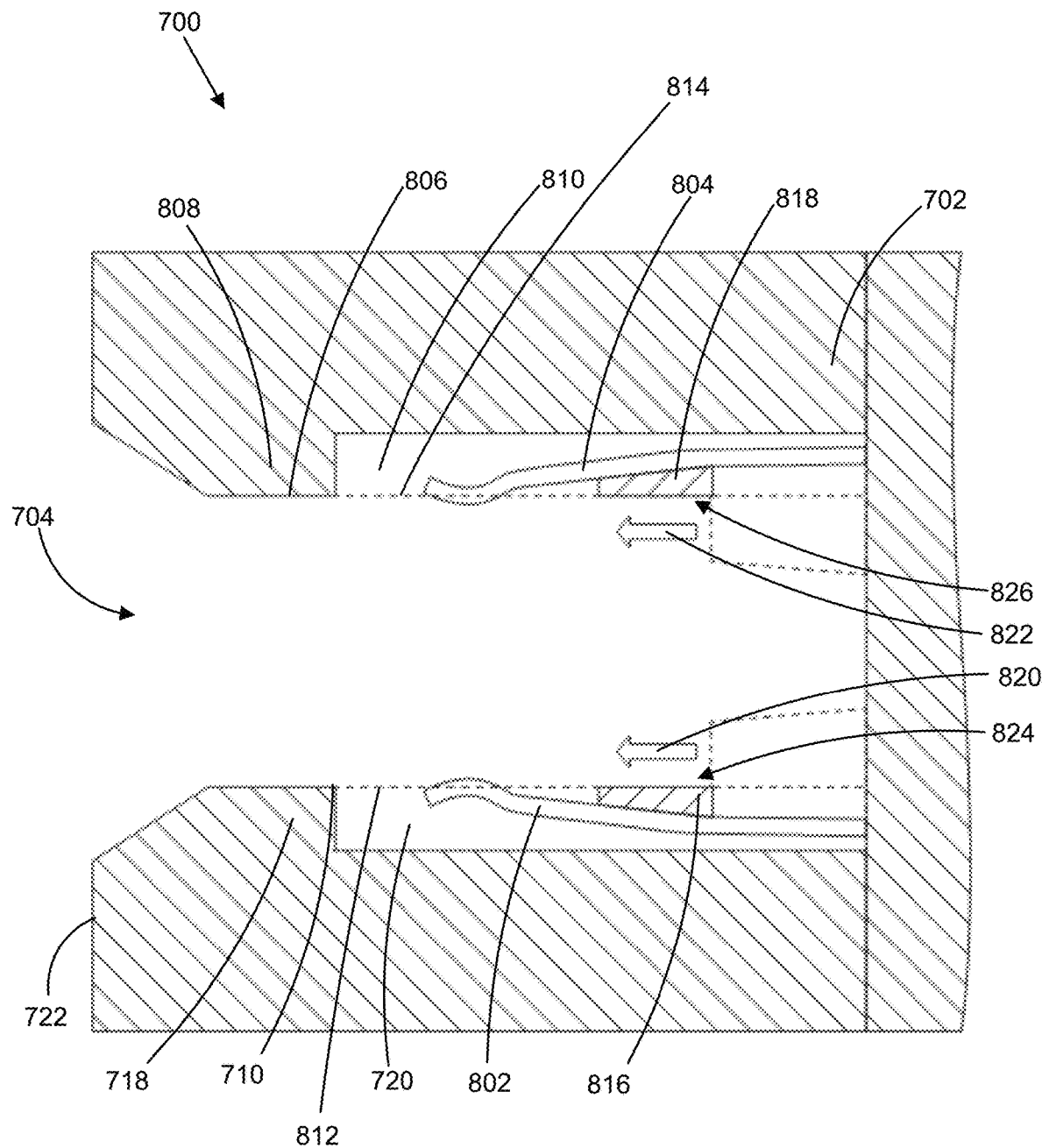
FIG. 8 illustrates a cross-sectional view of the example connector of FIG. 7 with the retraction mechanism in an unactuated state, according to various embodiments.

FIG. 8 illustrates a cross-sectional view of the example connector 700 of FIG. 7 with the retraction mechanism in an unactuated state, according to various embodiments. The housing 702 may include the first lip 718 and a second lip 808. The first lip 718 may be located at the first side 710 of the recess 704. The second lip 808 may be located at a second side 806 of the recess 704.

The recess 704 may include a first cutout 720 and a second cutout 810. The first cutout 720 may be located at a first side 710 of the recess 704 and may be located adjacent to the first lip 718. In particular, the first lip 718 may be located between the first cutout 720 and the first side 722 of the housing 702. The second cutout 810 may be located at the second side 806 of the recess 704 and may be located adjacent to the second lip 808. In particular, the second lip 808 may be located between the second cutout 810 and the first side 722 of the housing 702.

The connector 700 may include a first contact 802 and a second contact 804. The first contact 802 may be included in the contacts 706 (FIG. 7) within the first row 708 (FIG. 7), which may be located along the first side 710 of the recess 704. The first contact 802 may be located partially within the first cutout 720 (an upper side of the first cutout 720 illustrated by dotted line 812), with a portion of the first contact 802 extending out of the first cutout 720.

The second contact 804 may be included in the contacts 706 within the second row, which may be located along the second side 806 of the recess 704. The second contact may be located partially within the second cutout 810 (a lower side of the second cutout 810 illustrated by dotted line 814), with a portion of the second contact 804 extending out of the second cutout 810.

The connector 700 may include a first pretension element 816 and a second pretension element 818. The first pretension element 816 may be included in the pretension elements 714 (FIG. 7) within the first row 716 (FIG. 7). The first pretension element 816 may be located at a first position 824 within the first cutout 720. Further, the first pretension element 816 may abut the first contact 802 and may contact a portion of the first contact 802. The first contact 802 may be located between the first pretension element 816 and the first side 710 of the recess 704.

The second pretension element 818 may be included in the pretension elements 714 (FIG. 7) within the second row. The second pretension element 818 may be located at a first position 826 within the second cutout 810. Further, the second pretension element 818 may abut the second contact 804 and may contact a portion of the second contact 804. The second contact 804 may be located between the second pretension element 818 and the second side 806 of the recess 704.

Figure 9:
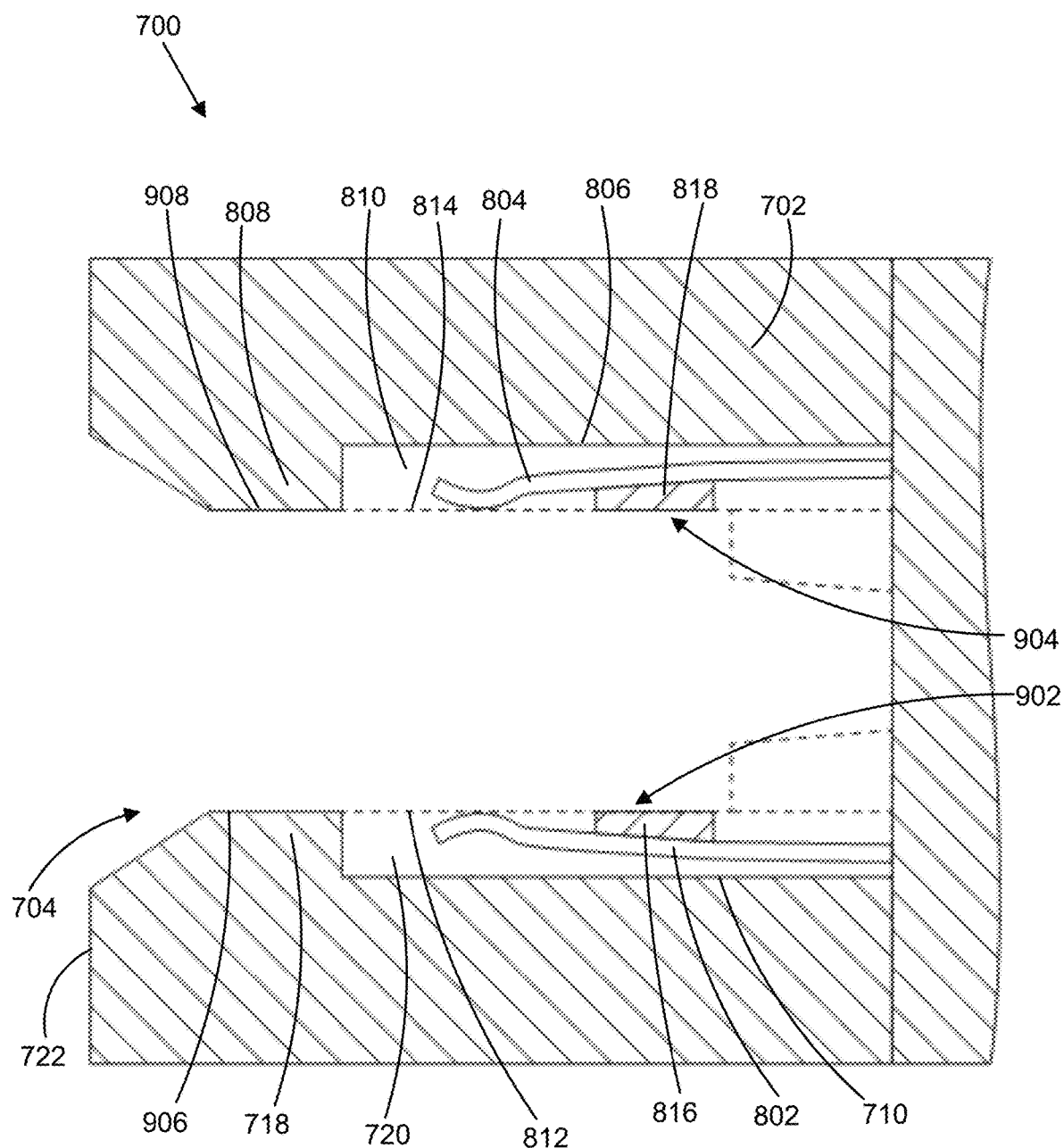
FIG. 9 illustrates a cross-sectional view of the example connector of FIG. 7 with the retraction mechanism in an actuated state, according to various embodiments.

The first pretension element 816 and the second pretension element 818 may translate along the first side 710 of the recess 704 and the second side 806 of the recess 704, respectively, when the retraction mechanism is actuated, as illustrated by arrow 820 and arrow 822. For example, the first pretension element 816 may translate toward the first side 722 of the housing 702 in a direction substantially (within 5 degrees) parallel to the first side 710 when the retraction mechanism is actuated. Further, the second pretension element 818 may translate toward the first side 722 of the housing 702 in a direction substantially (within 5 degrees) parallel to the second side 806 when the retraction mechanism is actuated. As the first pretension element 816 is translated, the first pretension element 816 may slide along the first contact 802 and apply a force to the first contact 802 that causes the first contact 802 to flex into the first cutout 720, as illustrated in FIG. 9. Further, as the second pretension element 818 is translated, the second pretension element 818 may slide along the second contact 804 and apply a force to the second contact 804 that causes the second contact 804 to flex into the second cutout 810, as illustrated in FIG. 9. In some embodiments, the first pretension element 816 and the second pretension element 818 may be translated at a same time, such as in response to activation of the cam mechanism 712 (FIG. 7).

FIG. 9 illustrates a cross-sectional view of the example connector 700 of FIG. 7 with the retraction mechanism in an actuated state, according to various embodiments. In the actuated state, the first pretension element 816 may be located at a second position 902 within the first cutout 720, which is located closer to the first side 722 of the housing 702 than the first position 824 illustrated in FIG. 8. Further, in the actuated state, the second pretension element 818 may be located at a second position 904 within the second cutout 810, which is located closer to the first side 722 of the housing 702 than the first position 826 illustrated in FIG. 8.

With the first pretension element 816 located in the second position 902, the first pretension element 816 may apply a force to the first contact 802 that causes the first contact 802 to flex toward the first side 710 of the recess 704. For example, the first contact 802 may be flexed to a position where an entirety of the first contact 802 is located within the first cutout 720 (wherein the dotted line 812 illustrates the upper side of the first cutout 720). Further, the first contact 802 may be flexed behind the first lip 718, such that the first lip 718 is located between the first side 722 of the housing 702 and an entirety of the first contact 802.

With the second pretension element 818 located in the second position 904, the second pretension element 818 may apply a force to the second contact 804 that causes the second contact 804 to flex toward the second side 806 of the recess 704. For example, the second contact 804 may be flexed to a position where an entirety of the second contact 804 is located within the second cutout 810 (wherein the dotted line 814 illustrates the lower side of the second cutout 810). Further, the second contact 804 may be flexed behind the second lip 808, such that the second lip 808 is located between the first side 722 of the housing 702 and an entirety of the second contact 804.

The portion of IC package may be inserted into the recess 704 between a wall 906 of the first lip 718 and a wall 908 of the second lip 808. The first lip 718 and the second lip 808 may prevent the portion of the IC package from entering into the first cutout 720 and the second cutout 810. In other embodiments, the portion of the IC package may enter the first cutout 720 and/or the second cutout 810, but may avoid contact with the first contact 802 and the second contact 804 when the retraction mechanism is actuated. Accordingly, the portion of the IC package may avoid contact with the first contact 802, the second contact 804, the first pretension element 816, and the second pretension element 818 when the retraction mechanism is actuated. The retraction mechanism may be actuated during insertion and/or removal of the portion of the IC package to or from the recess 704 to prevent damage to the first contact 802 and the second contact 804 that may occur during the insertion and/or removal. When the portion of the IC package is positioned within the recess 704, the retraction mechanism may be unactuated (as illustrated in FIG. 8), which may allow the first contact 802 and the second contact 804 to extend out of the first cutout 720 and the second cutout 810, respectively, and contact a first pad and a second pad, respectively, of the portion of the IC package located within the recess 704.

Based on the IC package avoiding contact with the first contact 802 and the second contact 804 when the retraction mechanism is in the actuated state, excess stub length of the first contact 802 and the second contact 804 required in legacy contacts to avoid damage to the contacts during insertion may be avoided in the embodiments disclosed herein. Accordingly, the stub length of the contacts 706 (FIG. 7), the first contact 802, and/or the second contact 804 may be shorter than legacy contacts. In some embodiments, the stub length of the contacts 706, the first contact 802, and/or the second contact 804 may be less than 0.3 millimeters. Shorter stub lengths may present less signal degradation caused by contact stub effect than longer stub lengths.

Figure 10:
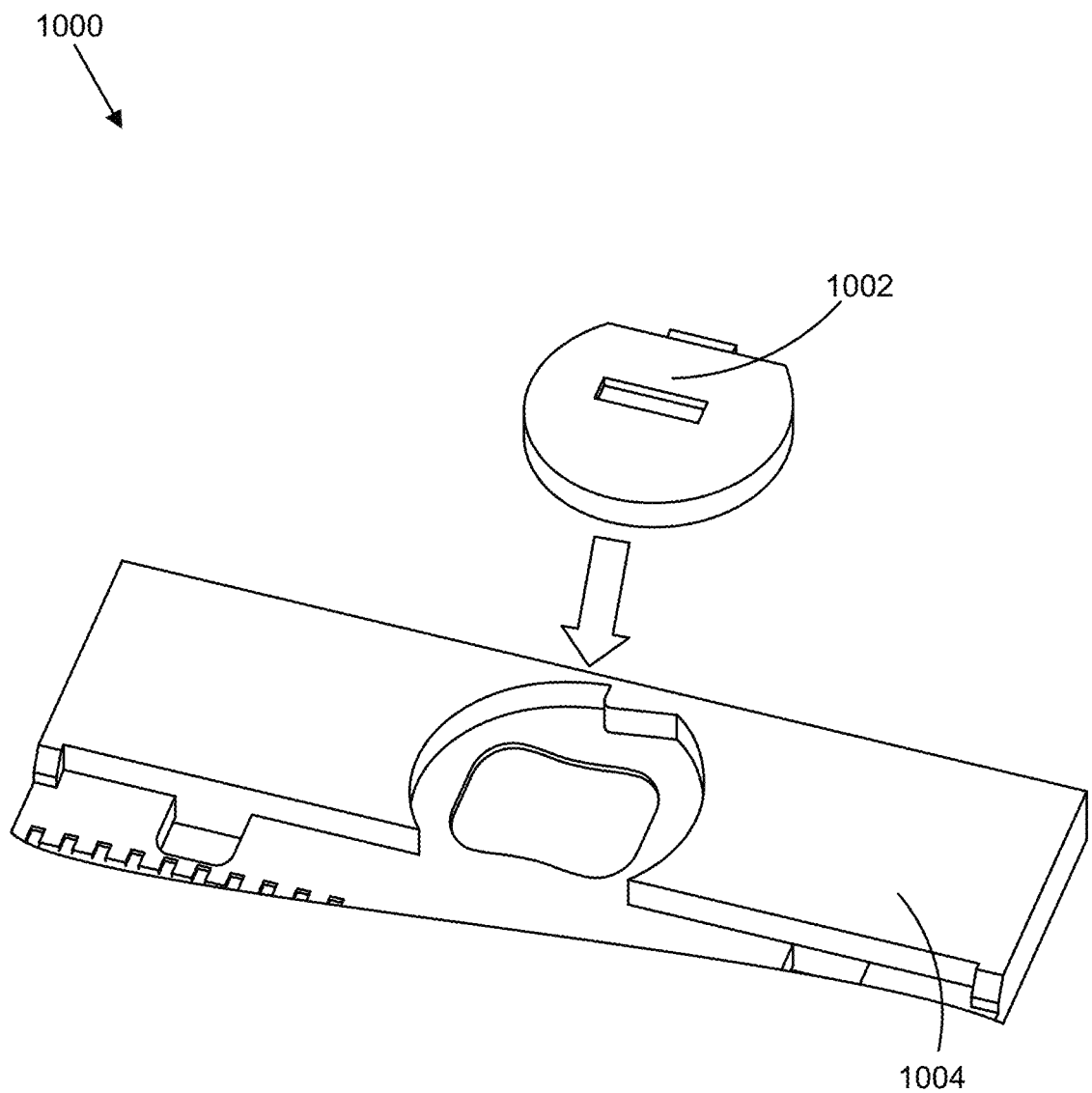
FIG. 10 illustrates an example cam mechanism, according to various embodiments.

FIG. 10 illustrates an example cam mechanism 1000, according to various embodiments. For example, the cam mechanism 1000 may be implemented as the cam mechanism 712 (FIG. 7) and may include one or more of the features of the cam mechanism 712. The cam mechanism 1000 may be coupled to a housing (such as the housing 702 (FIG. 7)) and may control actuation of the retraction mechanism. For example, the cam mechanism 1000 may cause pretension elements (such as the pretension elements 714 (FIG. 7), the first pretension element 816 (FIG. 8), and/or the second pretension element 818 (FIG. 8)) to transition between positions associated with the actuated and the non-actuated state.

The cam mechanism 1000 may include an interaction element 1002. A user and/or a piece of equipment may interact with the interaction element 1002 to place the retraction mechanism in the actuated state and/or the unactuated state. In the illustrated embodiment, the interaction element 1002 may comprise a rotational interaction element. In particular, the rotation interaction element may be rotated between a first rotational position associated with the unactuated state of the retraction mechanism and a second rotational position associated with the actuated state of the retraction mechanism. In some embodiments, the interaction element 1002 may return to the unactuated state absent interaction with the interaction element 1002.

The cam mechanism 1000 may further include a coupling mechanism 1004. The coupling mechanism 1004 may couple the interaction element 1002 with a pretension feature (such as the pretension feature 1100 illustrated in FIG. 11). The coupling mechanism 1004 may cause the pretension feature to be translated based on the interaction element 1002, as is discussed further in regard to FIG. 11.

Figure 11:
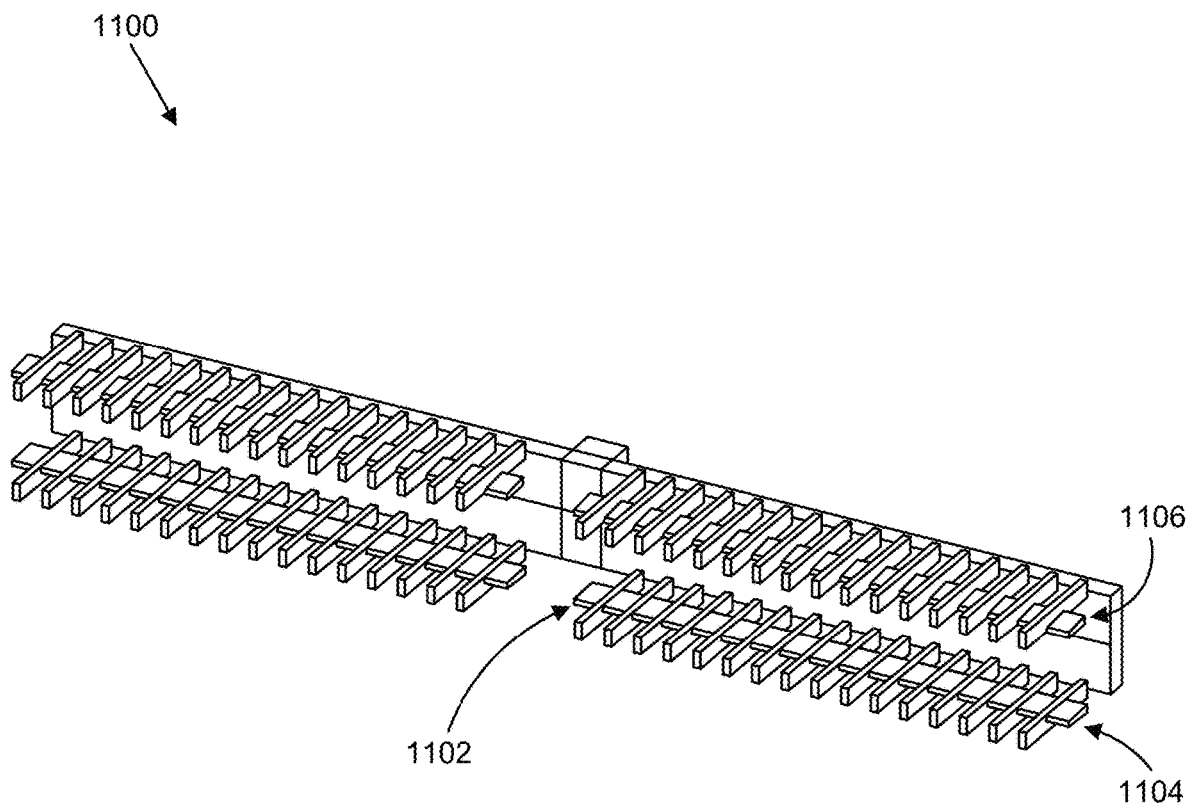
FIG. 11 illustrates an example pretension assembly, according to various embodiments.

FIG. 11 illustrates an example pretension feature 1100, according to various embodiments. The pretension feature 1100 may be coupled to a coupling mechanism (such as the coupling mechanism 1004) and may be translated based on an interaction element (such as the interaction element 1002). The pretension feature 1100 may further be coupled to a housing (such as the housing 702 (FIG. 7)) and a portion of the pretension feature 1100 may extend into a recess (such as the recess 704 (FIG. 7)) of the housing.

The pretension feature 1100 may include one or more pretension elements 1102. The pretension elements 1102 may include one or more of the features of the pretension elements 714 (FIG. 7), the first pretension element 816 (FIG. 8), and/or the second pretension element 818 (FIG. 8). The pretension elements 1102 may extend into the recess and may be arranged within the recess and operate similarly to the arrangement and operation of the pretension elements 714, the first pretension element 816, and/or the second pretension element 818. In particular, the pretension elements 1102 may comprise a first row 1104 of the pretension elements 1102, which may be arranged along a first side (such as the first side 710 (FIG. 7)) of the recess and may translate along the first side of the recess. Further, the pretension elements 1102 may comprise a second row 1106 of the pretension elements 1102, which may be arranged along a second side (such as the second side 806 (FIG. 8)) of the recess and may translate along the second side of the recess.

The pretension feature 1100 may translate based on actuation of the retraction mechanism controlled by a cam mechanism (such as the cam mechanism 1000 (FIG. 10)). As the pretension feature 1100 translates, the pretension elements 1102 may translate between first positions (such as the first position 824 (FIG. 8) and/or the first position 826 (FIG. 8)) associated with an unactuated state of the retraction mechanism and second positions (such as the second position 902 (FIG. 9) and/or the second position 904 (FIG. 9)) associated with an actuated state of the retraction mechanism based on the interaction element. In the illustrated embodiment, the entirety of the pretension feature 1100 may translate in a first direction to position the pretension elements 1102 in the first positions and in a second direction (opposite to the first direction) to position the pretension elements 1102 in the second positions based on interaction with the interaction element.

Figure 12:
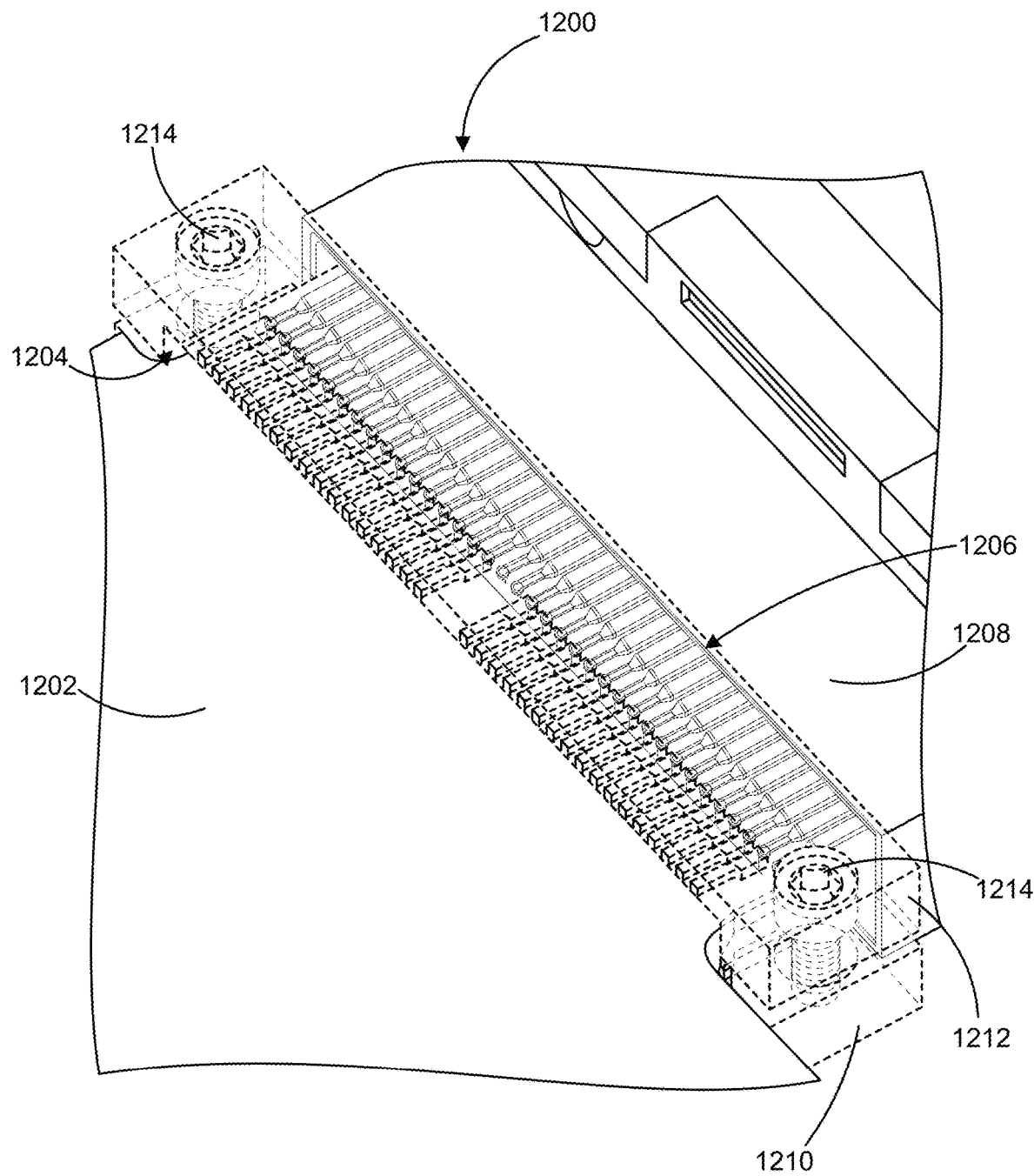
FIG. 12 illustrates an example connector, according to various embodiments.

FIG. 12 illustrates an example connector 1200 mated to an IC package 1202, according to various embodiments. In particular, a portion of the IC package 1202 may extend into a recess 1204 of the connector 1200. The portion of the IC package 1202 may comprise a diving board (such as an HFI diving board) of the IC package 1202. One or more contacts 1206 of the connector 1200 may contact one or more pads of the IC package 1202 and electrically couple to the pads.

The connector 1200 may include a housing 1208. The housing 1208 may comprise an alligator-type or clamp-type housing, wherein a portion of the housing 1208 may clamp onto the portion of the IC package 1202. In the illustrated embodiment, the housing 1208 may include a first clamp portion 1210 and a second clamp portion 1212. The first clamp portion 1210 and the second clamp portion 1212 may be coupled together via one or more fasteners 1214. The fasteners 1214 may cause the first clamp portion 1210 and the second clamp portion 1212 to move together or apart depending on the engagement of the fasteners 1214. In particular, the fasteners 1214 may include screws in the illustrated embodiment, wherein the first clamp portion 1210 and the second clamp portion 1212 are moved together or apart depending on the rotation of the screws. The first clamp portion 1210 and the second clamp portion 1212 may clamp onto the portion of the IC package when the first clamp portion 1210 and the second clamp portion 1212 are moved together, which may affix the connector 1200 to the portion of the IC package 1202 and cause the contacts 1206 of the connector 1200 to contact pads of the IC package 1202. In other embodiments, the housing 1208 may be a friction-lock housing and may omit the first clamp portion 1210 and the second clamp portion 1212.

The housing 1208 may have the recess 1204 located between the first clamp portion 1210 and the second clamp portion 1212. The recess 1204 may receive the portion of the IC package 1202 when the connector 1200 is mated with the IC package 1202. A height of the recess 1204 (measured from a bottom side of the recess 1204 that abuts the first clamp portion 1210 to a top side of the recess 1204 that abuts the second clamp portion 1212) may be adjustable based on the movement of the first clamp portion 1210 and the second clamp portion 1212. The height of the recess 1204 may be adjusted to the thickness of the portion of the IC package 1202, wherein a portion of the first clamp portion 1210 located at the bottom side of the recess 1204 and a portion of the second clamp portion 1212 located at the top side of the recess 1204 may contact the portion of the IC package 1202.

The contacts 1206 may be coupled to the housing 1208 and may extend into the recess 1204 of the housing 1208. The contacts 1206 may comprise elastomer contacts. The features of the contacts 1206 are described further in relation to FIGS. 12 through 16.

Figure 13:
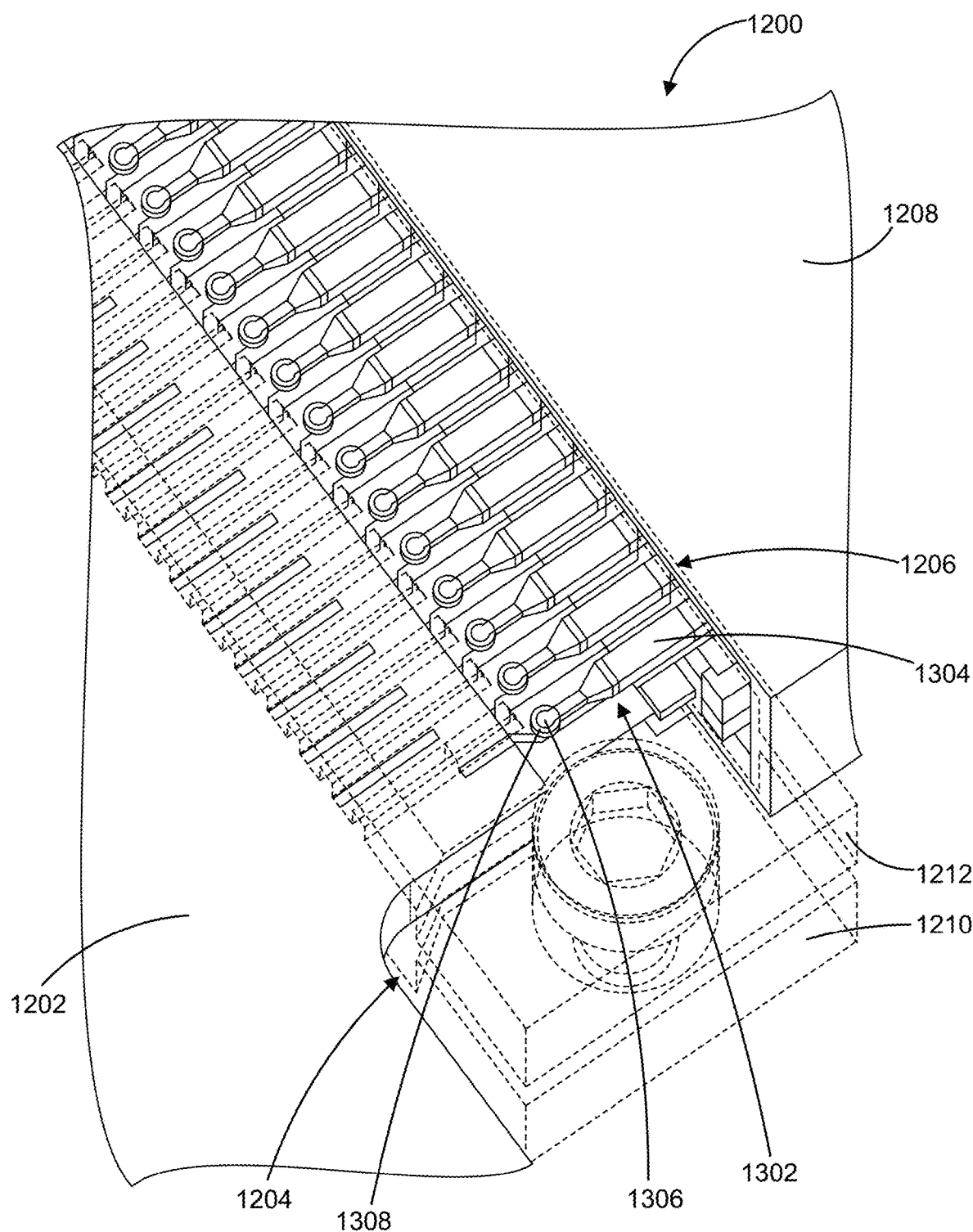
FIG. 13 illustrates an enlarged view of a portion of the example connector of FIG. 12, according to various embodiments.

FIG. 13 illustrates an enlarged view of a portion of the example connector 1200 and IC package 1202 of FIG. 12, according to various embodiments. The contacts 1206 may include a first contact 1302. The first contact 1302 may be representative of each of the contacts 1206.

The first contact 1302 may include a main body 1304. The main body 1304 may extend from the housing 1208 of the connector 1200 into the recess 1204 of the housing 1208. The main body 1304 may comprise a conductive metal. For example, the main body 1304 may comprise copper, gold, platinum, palladium, alloys thereof, or some combination thereof. In some embodiments, the main body 1304 may comprise copper with gold plating. The main body 1304 may include a tip 1306 located at an opposite end of the main body 1304 from the housing 1208.

The first contact 1302 may further include an elastomer element 1308. The elastomer element 1308 may be affixed to the tip 1306 of the main body 1304 and may be electrically coupled to the main body 1304. The elastomer element 1308 may be polymer-based and may include electrically-conductive fillers. For example, the electrically-conductive fillers may include electrically-conductive metal fillers, which may comprise copper, gold, platinum, palladium, alloys thereof, or some combination thereof. The elastomer element 1308 may be insert molded to the tip 1306 and/or may be soldered to the tip 1306.

The elastomer element 1308 may contact a pad of the IC package 1202 when the connector 1200 is mated with the IC package 1202. For example, the first clamp portion 1210 and the second clamp portion 1212 may, in combination, apply a force to the first contact 1302 that causes the elastomer element 1308 to be pressed against the pad of the IC package 1202 when the connector 1200 is mated to the IC package 1202. The first clamp portion 1210 and the second clamp portion 1212 may be unclamped, which may remove the force to the first contact 1302 and allow the first contact 1302 to move away from the pad. With the first clamp portion 1210 and the second clamp portion 1212 unclamped, the IC package 1202 may be removed from and/or inserted into the connector 1200 without making contact with the first contact 1302.

The elastomer element 1308 may have a footprint of a certain shape and size. For example, the elastomer element 1308 may have a diameter of approximately 0.3 millimeters. In other embodiments, the diameter of the elastomer element 1308 may be less than or greater than 0.3 millimeters. Further, for example, the footprint of the elastomer element 1308 may be circle-shaped. In some embodiments, the pad may have a footprint that is approximately (within 0.2 square millimeters) a same size as the footprint of the elastomer element 1308. Further, in some embodiments, the pad may be approximately (allowing for variances due to manufacturing procedures) a same shape as the footprint of the elastomer element 1308.

Figure 14:
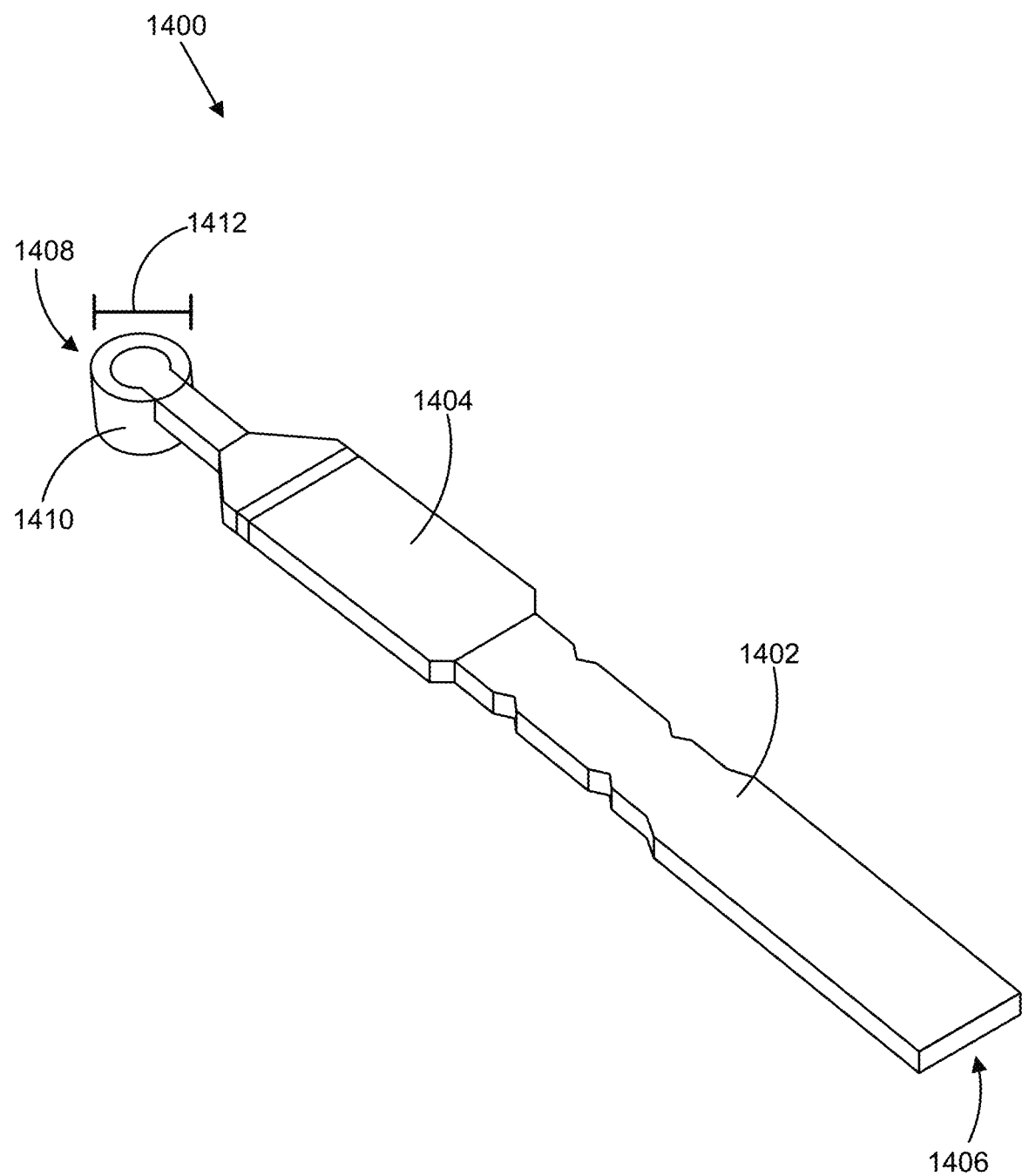
FIG. 14 illustrates an example contact for the connector of FIG. 12, according to various embodiments.

FIG. 14 illustrates an example contact 1400 that may be implemented in the connector 1200 of FIG. 12, according to various embodiments. In particular, the contact 1400 may be coupled to the housing 1208 (FIG. 12) of the connector 1200 and extend into the recess 1204 (FIG. 12) of the connector 1200. The contact 1400 may include one or more of the features of the contacts 1206 (FIG. 12) and/or the first contact 1302 (FIG. 13).

The contact 1400 may include a portion of conductive metal and a portion of an elastomer. In particular, the portion of the conductive metal may include a mounting portion 1402 and a main body 1404. The portion of an elastomer may include an elastomer element 1410.

The contact 1400 may include the mounting portion 1402. The mounting portion 1402 may be located at a first end 1406 of the contact 1400. The mounting portion 1402 may extend into a housing (such as the housing 1208) and may couple the contact 1400 to the housing. For example, the mounting portion 1402 may be located within an aperture of the housing and may mount the contact 1400 to the housing via friction between the mounting portion 1402 and the housing. In some embodiments, the mounting portion 1402 may further couple to the housing via epoxy and/or features of the housing that interact with the mounting portion 1402.

The contact 1400 may further include the main body 1404. The main body 1404 may be located at an end of the mounting portion 1402. In some embodiments, the main body 1404 may extend planar to the mounting portion 1402. The main body 1404 may extend from the housing into a recess (such as the recess 1204) when the contact 1400 is coupled to the housing. For example, the main body 1404 may extend substantially (within five degrees) perpendicular from the housing.

The contact 1400 may further include the elastomer element 1410. The elastomer element 1410 may include one or more of the features of the elastomer element 1308 (FIG. 13). The elastomer element 1410 may be located at a second end 1408 of the contact 1400. The elastomer element 1410 may be affixed at the second end 1408 via insert mold or solder. In particular, the elastomer element 1410 may be affixed to the portion of conductive metal. In some embodiments, the elastomer element 1410 may be affixed to a portion of the main body 1404.

The elastomer element 1410 may have a certain shape and size. In the illustrated embodiment, the elastomer element 1410 is illustrated as a cylinder, with a circle-shaped footprint to be directed toward where the IC package is to be received when implemented in the connector. The elastomer element 1410 may be other shapes and may have other shapes of footprints. Further, in the illustrated embodiment, the elastomer element 1410 may have a diameter 1412 of approximately (within 0.1 millimeters) 0.3 millimeters. In other embodiments, the diameter 1412 may be less than or greater than 0.3 millimeters.

Figure 15:
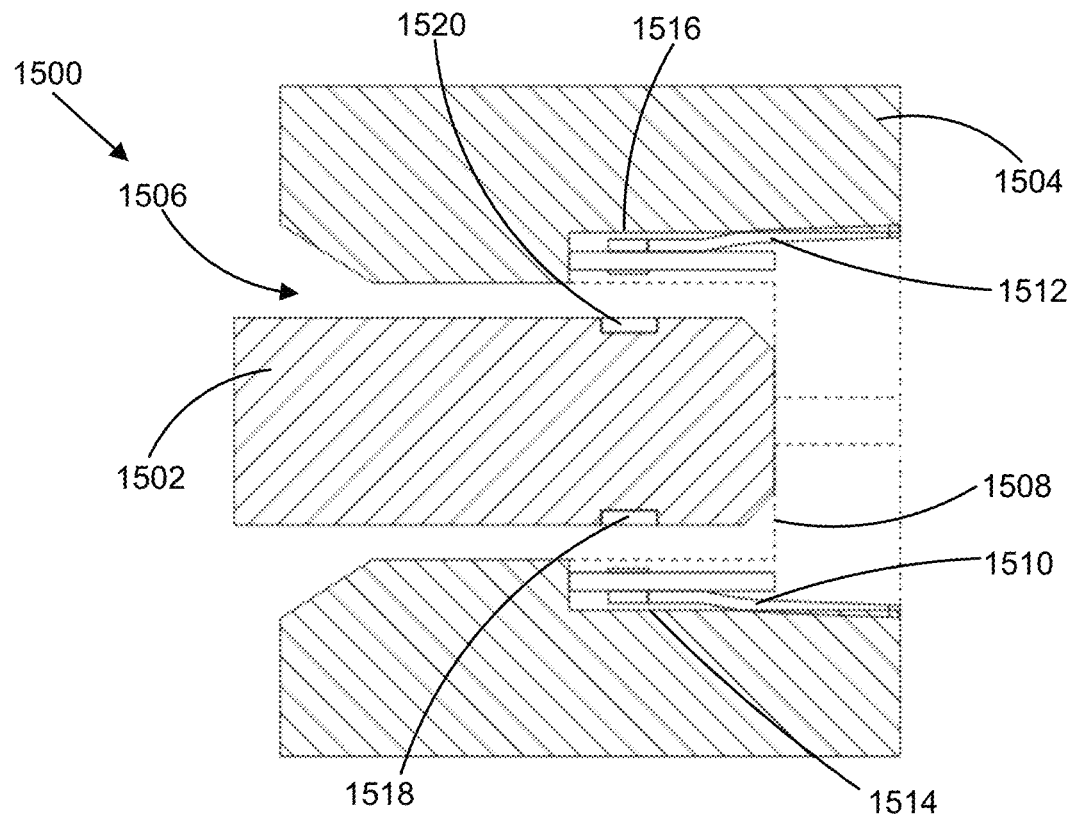
FIG. 15 illustrates a cross-sectional view of an example connector that mates with an IC package in an unclamped state, according to various embodiments.

FIG. 15 illustrates a cross-sectional view of an example connector 1500 that mates with an IC package 1502 in an unclamped state, according to various embodiments. The connector 1500 may include one or more of the features of the connector 1200 (FIG. 12).

The connector 1500 may include a housing 1504 with a recess 1506. The IC package 1502 may be located within the recess 1506. The IC package 1502 may be positioned against a back wall 1508 of the housing 1504.

The connector 1500 may further include a first contact 1510 and a second contact 1512. The first contact 1510 and the second contact 1512 may each include one or more of the features of the contacts 1206 (FIG. 12), the first contact 1302 (FIG. 13), and/or the contact 1400 (FIG. 14). The first contact 1510 may extend along a first side 1514 of the recess 1506. The second contact 1512 may extend along a second side 1516 of the recess 1506, the second side 1516 being located opposite from the first side 1514. A portion of the IC package 1502 may be located between the first contact 1510 and the second contact 1512. A first pad 1518 of the IC package 1502 may be aligned with the first contact 1510 and a second pad 1520 of the IC package 1502 may be aligned with the second contact 1512. The IC package 1502 being positioned against the back wall 1508 may facilitate the alignment of the first pad 1518 and the second pad 1520 with the first contact 1510 and the second contact 1512, respectively.

In the illustrated embodiment, a first clamp portion (such as the first clamp portion 1210 (FIG. 12)) and a second clamp portion (such as the second clamp portion 1212 (FIG. 12)) may be in an unclamped state. Based on the first clamp portion and the second clamp portion being in the unclamped state, the first contact 1510 may be located in a first position of the first contact 1510 away from the IC package 1502 and the second contact 1512 may be located in a first position of the second contact 1512 away from the IC package 1502. In particular, the first contact 1510 and the second contact 1512 may be positioned away from where the IC package 1502 is to be received within the recess 1506, such that the IC package 1502 avoids contact with the first contact 1510 and the second contact 1512 when being inserted into and removed from the recess 1506.

Figure 16:
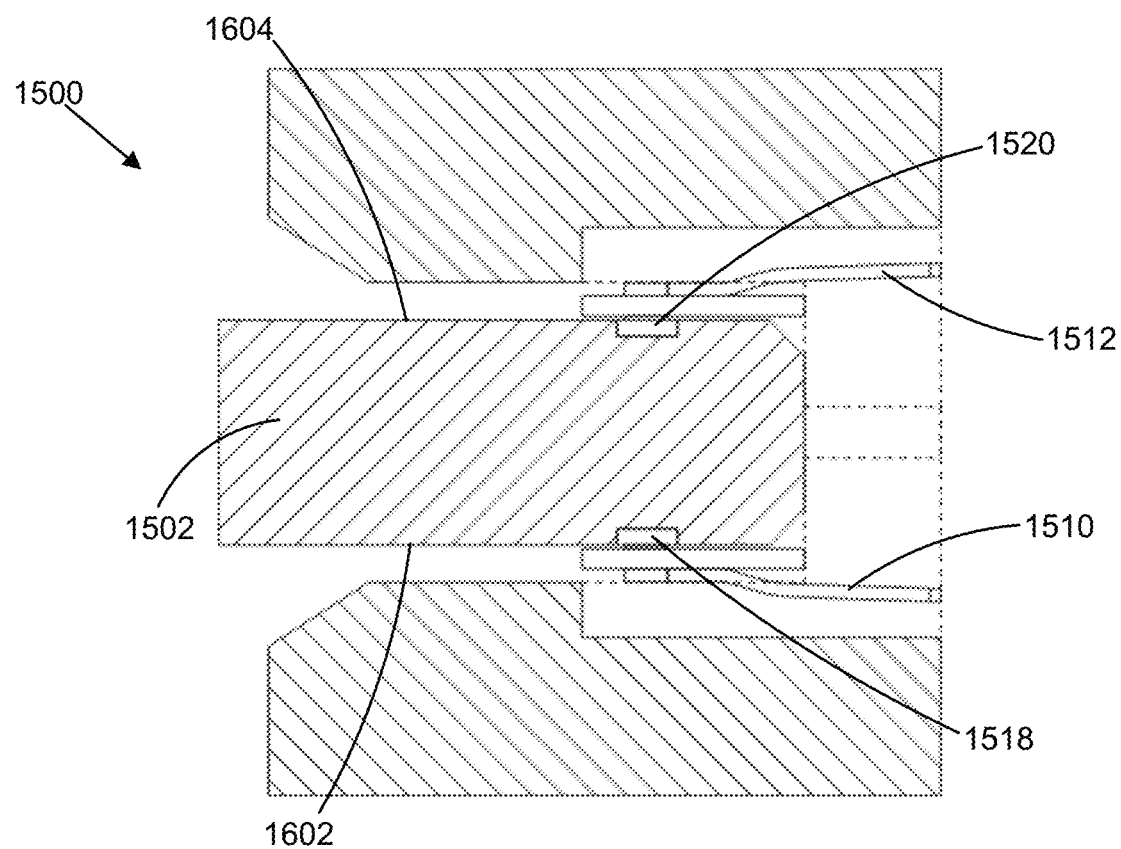
FIG. 16 illustrates a cross-sectional view of the example connector of FIG. 15 in a clamped state, according to various embodiments.

FIG. 16 illustrates a cross-sectional view of the example connector 1500 of FIG. 15 in a clamped state, according to various embodiments. In the illustrated embodiment, the first clamp portion (such as the first clamp portion 1210 (FIG. 12)) and the second clamp portion (such as the second clamp portion 1212 (FIG. 12)) may be in a clamped state. Based on the first clamp portion and the second clamp portion being in the clamped state, the first contact 1510 may be positioned in a second position of the first contact 1510, located against a first side 1602 of the IC package 1502. Further, based on the first clamp portion and the second clamp portion being in the clamped state, the second contact 1512 may be located in a second position of the second contact 1512, located against a second side 1604 of the IC package 1502. The first contact 1510 may contact the first pad 1518 and may be electrically coupled to the first pad 1518. Further, the second contact 1512 may contact the second pad 1520 and may be electrically coupled to the second pad 1520.

Figure 17:
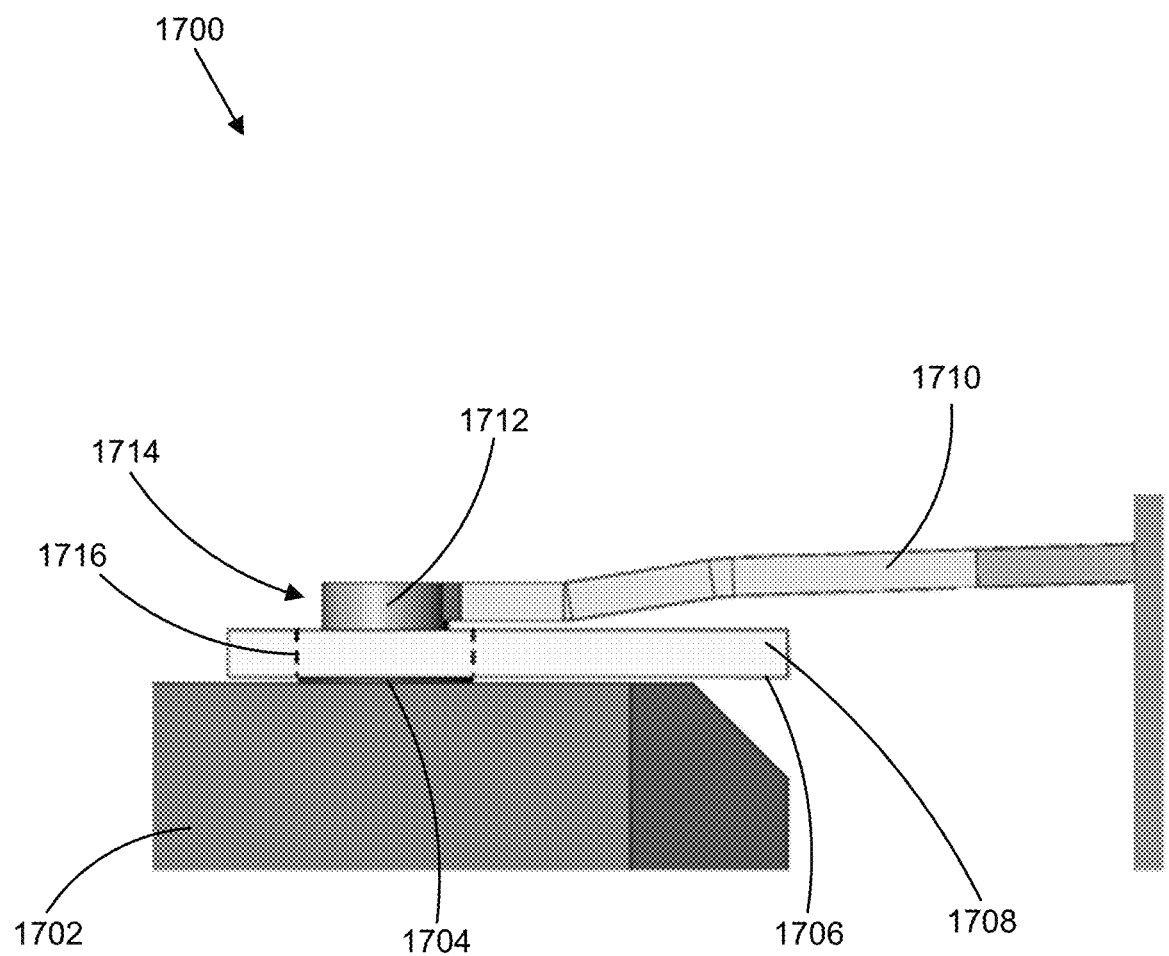
FIG. 17 illustrates an example contact arrangement, according to various embodiments.

FIG. 17 illustrates an example contact arrangement 1700, according to various embodiments. The contact arrangement 1700 may be representative of contact arrangements implemented by the connector 1200 (FIG. 12) and/or the connector 1500 (FIG. 15). The contact arrangement 1700 may include an IC package 1702. The IC package 1702 may include a pad 1704 located at a surface 1706 of the IC package 1702.

The contact arrangement 1700 may include a contact 1710. The contact 1710 may include one or more of the features of the contacts 1206 (FIG. 12), the first contact 1302 (FIG. 13), the contact 1400 (FIG. 14), the first contact 1510 (FIG. 15), and/or the second contact 1512 (FIG. 15). The contact 1710 may include an elastomer element 1712 located at an end 1714 of the contact 1710. The elastomer element 1712 may include one or more of the features of the elastomer element 1308 (FIG. 13). The elastomer element 1712 may contact the pad 1704 and may electrically couple the contact 1710 to the pad 1704.

The contact arrangement 1700 may further include a guide 1708. In some embodiments, the guide 1708 may be affixed to the IC package 1702 adjacent to the surface 1706 of the IC package 1702. In other embodiments, the guide 1708 may be affixed to the contact 1710. The guide 1708 may comprise a substrate. The substrate may be formed of one or more build-up layers. The guide 1708 may have an aperture 1716 that extends through the guide 1708. The aperture 1716 may facilitate alignment of the elastomer element 1712 with the pad 1704. For example, sidewalls of the aperture 1716 may be positioned along the perimeter of the pad 1704 and the elastomer element 1712 may be positioned to extend through the aperture 1716 to contact the pad 1704.

Figure 18:
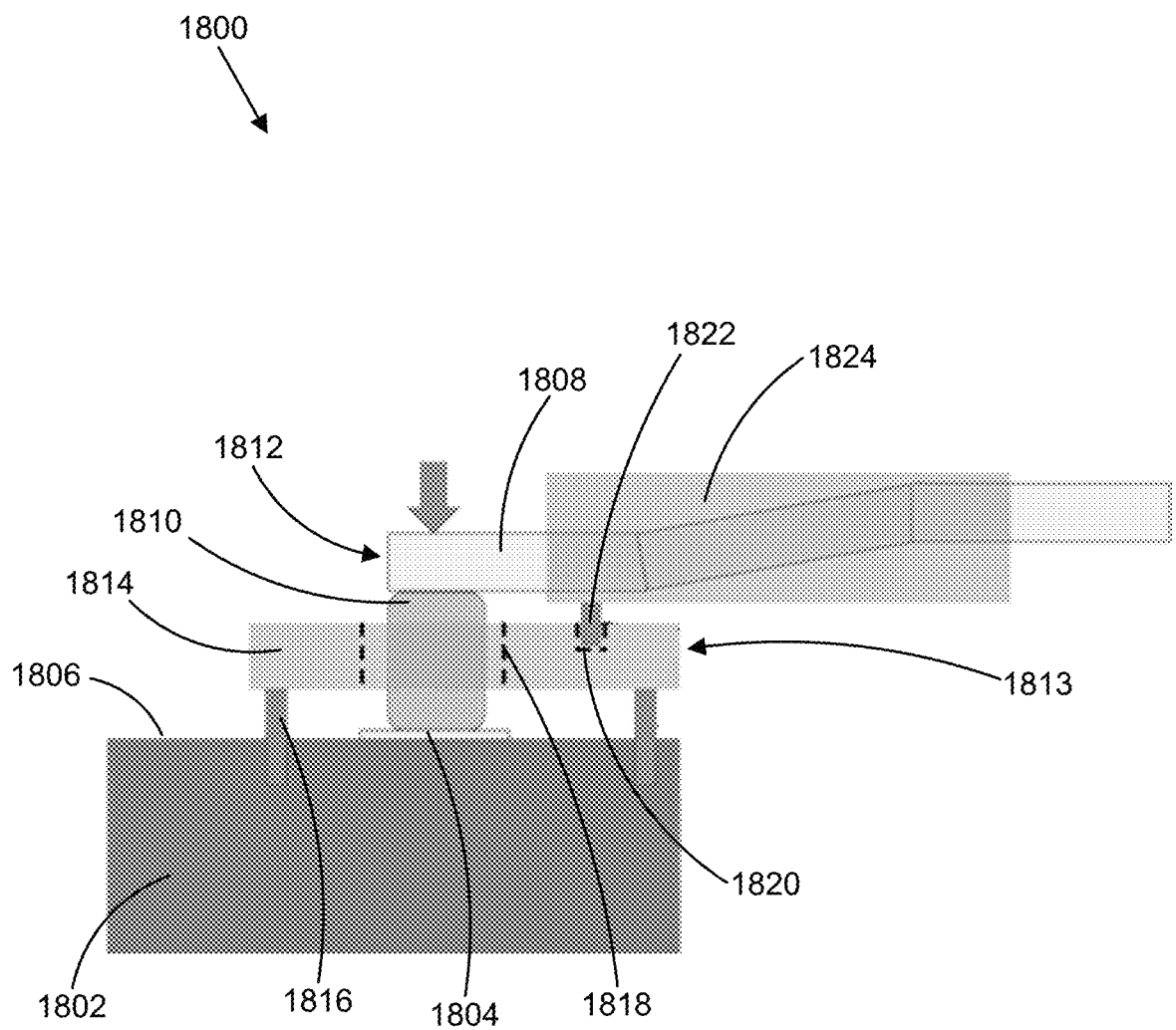
FIG. 18 illustrates another example connector arrangement, according to various embodiments.

FIG. 18 illustrates another example contact arrangement 1800, according to various embodiments. The contact arrangement 1800 may be representative of contact arrangements implemented by the connector 1200 (FIG. 12) and/or the connector 1500 (FIG. 15). The contact arrangement 1800 may include an IC package 1802. The IC package 1802 may include a pad 1804 located at a surface 1806 of the IC package 1802.

The contact arrangement 1800 may include a contact 1808. The contact 1808 may include one or more of the features of the contacts 1206 (FIG. 12), the first contact 1302 (FIG. 13), the contact 1400 (FIG. 14), the first contact 1510 (FIG. 15), and/or the second contact 1512 (FIG. 15). The contact 1808 may include an elastomer element 1810 located at an end 1812 of the contact 1808. The elastomer element 1810 may include one or more of the features of the elastomer element 1308 (FIG. 13). The elastomer element 1810 may contact the pad 1804 and may electrically couple the contact 1808 to the pad 1804.

The contact arrangement 1800 may further include an alignment pin 1822. The alignment pin 1822 may be coupled to the contact 1808. In some embodiments, the contact arrangement 1800 may further include an insert mold 1824 coupled to the portion of the contact 1808. The insert mold 1824 may couple the alignment pin 1822 to the contact 1808. The alignment pin 1822 may facilitate alignment of the elastomer element 1810 with the pad 1804.

The contact arrangement 1800 may further include a guide 1813. The guide 1813 may include a substrate 1814 and one or more connector pins 1816. The connector pins 1816 may extend from the surface 1806 of the IC package 1802 and may affix the substrate 1814 adjacent to the surface 1806 of the IC package 1802. The connector pins 1816 may affix the substrate 1814 at a position offset from the surface 1806.

The substrate 1814 may have an aperture 1818. The aperture 1818 may extend through the substrate 1818. The aperture 1818 may be aligned with the pad 1804. For example, sidewalls of the aperture 1818 may align with the perimeter of the pad 1804. The substrate 1814 may further include a recess 1820. The recess 1820 may receive the alignment pin 1822. For example, the alignment pin 1822 may be positioned within the recess 1820, wherein a portion of the alignment pin 1822 extends into the recess 1820. The alignment pin 1822 being positioned within the recess may cause the elastomer element 1810 to be aligned with the pad 1804.

Figure 19:
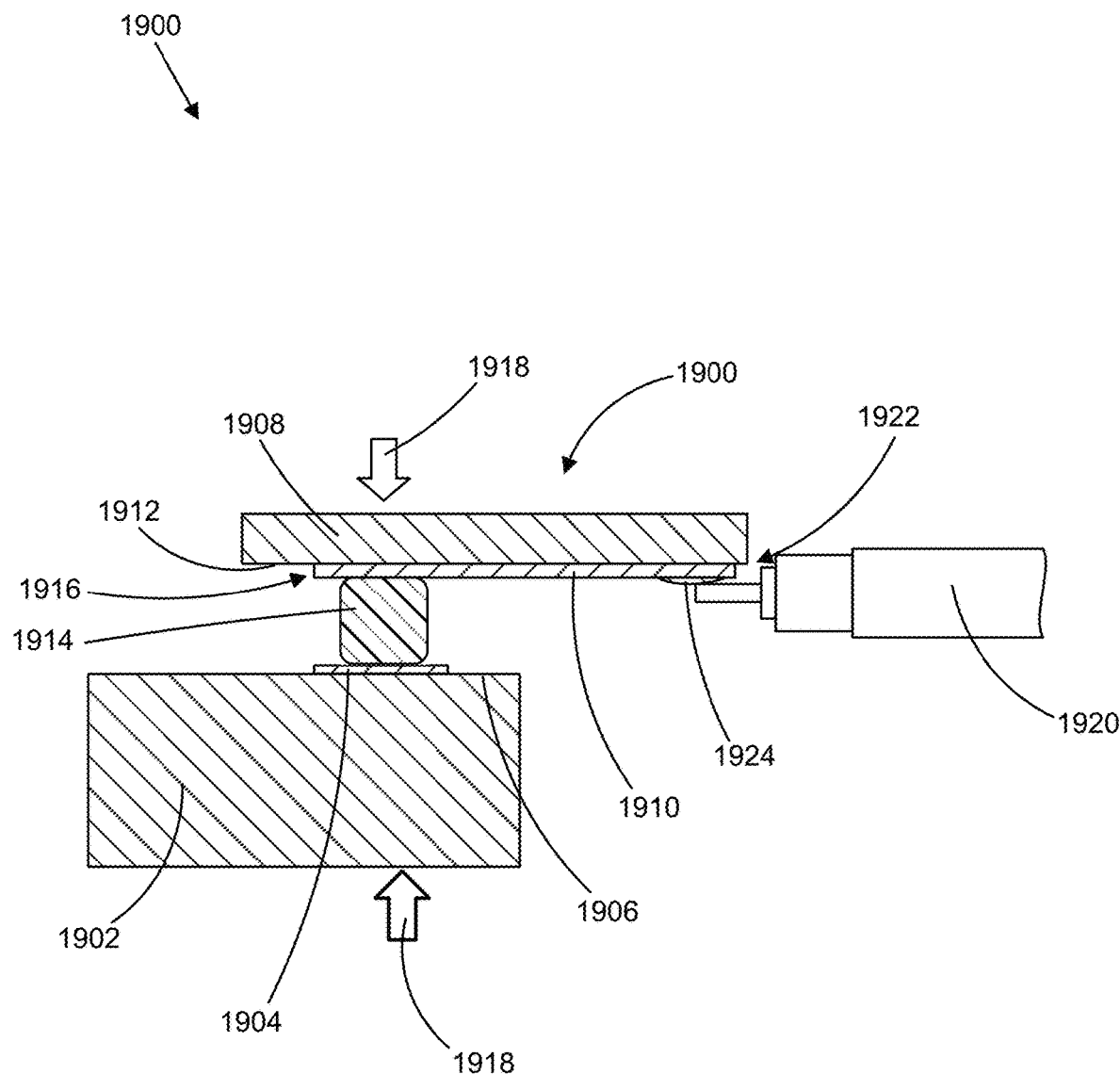
FIG. 19 illustrates another example connector for coupling to an IC package, according to various embodiments.

FIG. 19 illustrates another example connector 1900 for coupling to an IC package 1902, according to various embodiments. The IC package 1902 may include a pad 1904 located at a surface 1906 of the IC package 1902.

The connector 1900 may include a substrate 1908. The substrate 1908 may comprise one or more build-up layers. The connector 1900 may further include a trace 1910 affixed to the substrate 1908. The trace 1910 may be affixed to a surface 1912 of the substrate 1908. In other embodiments, the trace 1910 may be included within the substrate 1908 and may be located at the surface 1912 of the substrate 1908.

The connector 1900 may further include an elastomer element 1914. The elastomer element 1914 may further include one or more of the features of the elastomer element 1308 (FIG. 13). The elastomer element 1914 may be affixed to the trace 1910 toward a first end 1916 of the trace 1910 and may be electrically coupled to the trace 1910. The elastomer element 1914 may be affixed to the trace 1910 via solder, an electrically-conductive epoxy, or some combination thereof.

The elastomer element 1914 may be positioned against the pad 1904. In particular, a force (indicated by arrows 1918) may be applied to the connector 1900 and/or the IC package 1902, which causes the elastomer element 1914 to be pressed against the pad 1904. Contact between the elastomer element 1914 and the pad 1904 may electrically couple the pad 1904 to the trace 1910.

A cable 1920 may be electrically coupled to the connector 1900. The cable 1920 may comprise a Twinax cable. The cable 1920 may be electrically coupled to the trace 1910 toward a second end 1922 of the trace 1910. The cable 1920 may be electrically coupled to the trace 1910 via solder 1924. In other embodiments, the cable 1920 may be electrically coupled to the trace 1910 via solder, electrically-conductive epoxy, or some combination thereof. The connector 1900 may electrically couple the cable 1920 to the pad 1904. In particular, the cable 1920 may be electrically coupled to the pad 1904 via the elastomer element 1914 and the trace 1910 of the connector 1900.

Figure 20:
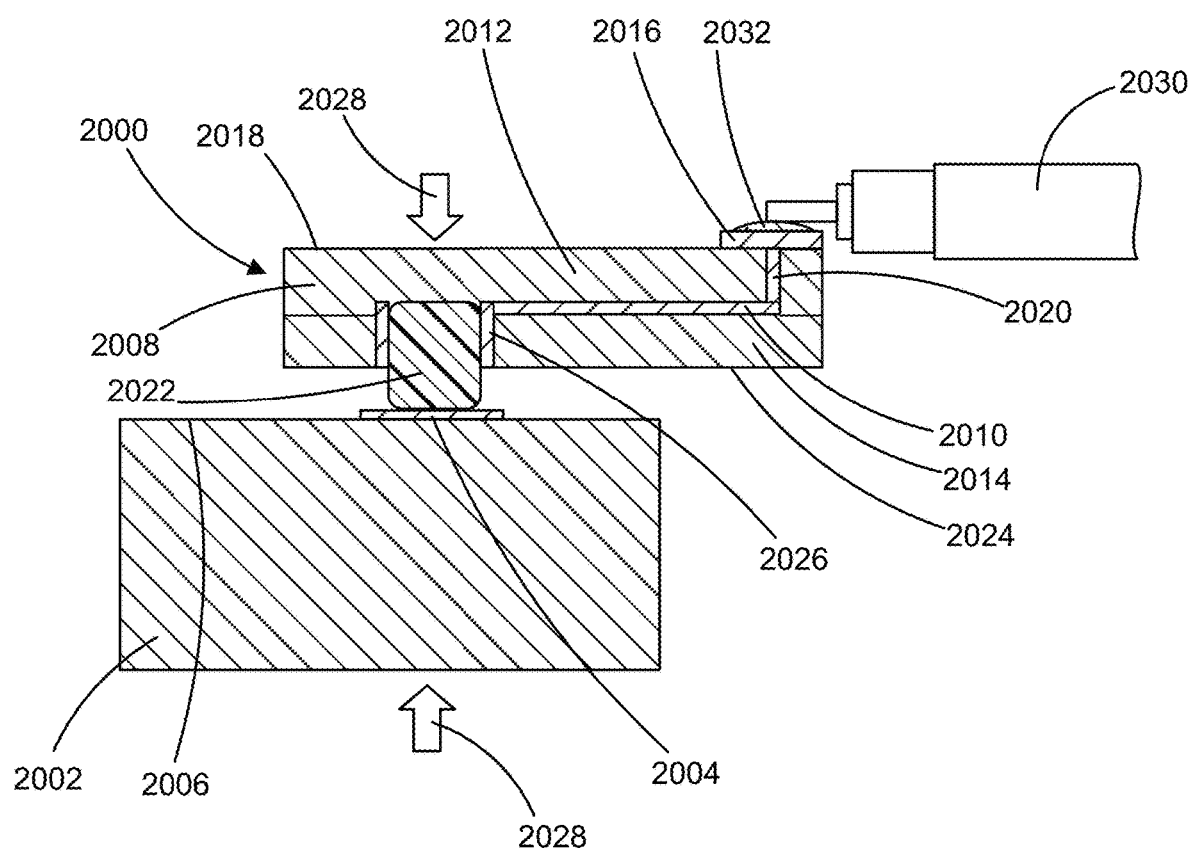
FIG. 20 illustrates another example connector for coupling to an IC package, according to various embodiments.

FIG. 20 illustrates another example connector 2000 for coupling to an IC package 2002, according to various embodiments. The IC package 2002 may include a pad 2004 located at a surface 2006 of the IC package 2002.

The connector 2000 may include a substrate 2008. The substrate 2008 may comprise one or more build-up layers. The connector 2000 may further include a trace 2010. The trace 2010 may be located within the substrate 2008. For example, the trace 2010 may be located between two of the build-up layers of the substrate 2008. In particular, a first portion 2012 of the substrate 2008 may be located on one side of the trace 2010 and a second portion 2014 of the substrate 2008 may be located on an opposite side of the trace 2010. The first portion 2012 and the second portion 2014 may each comprise one or more build-up layers.

The connector 2000 may include a pad 2016 located at a first surface 2018 of the substrate 2008. The connector 2000 may further include a via 2020 located within the substrate 2008 that extends from the trace 2010 to the pad 2016. The via 2020 may electrically couple the trace 2010 to the pad 2016.

The connector 2000 may further include an elastomer element 2022. The elastomer element 2022 may include one or more of the features of the elastomer element 1308 (FIG. 13). The elastomer element 2022 may be electrically coupled to the trace 2010. In particular, the elastomer element 2022 may extend into a second surface 2024 of the substrate 2008 and may contact one or more electrically-conductive sidewalls 2026 that are electrically coupled to the trace 2010. In some embodiments, the electrically conductive sidewalls 2026 may be omitted and the elastomer element 2022 may directly contact the trace 2010. In other embodiments, the elastomer element 2022 may be located at the second surface 2024 of the substrate 2008, wherein the connector 2000 may further include a second via that extends from the trace 2010 to the elastomer element 2022 and electrically couples the trace 2010 to the elastomer element 2022.

The elastomer element 2022 may be positioned against the pad 2004 of the IC package 2002. In particular, a force (indicated by arrows 2028) may be applied to the connector 2000 and/or the IC package 2002, which causes the elastomer element 2022 to be pressed against the pad 2004. Contact between the elastomer element 2022 and the pad 2004 may electrically couple the pad 2004 to the trace 2010, the via 2020, and the pad 2016 of the substrate 2008.

A cable 2030 may be electrically coupled to the connector 2000. The cable 2030 may comprise a Twinax cable. The cable 2030 may be electrically coupled to the pad 2016 of the substrate 2008. The cable 2030 may be electrically coupled to the pad 2016 via solder 2032. In other embodiments, the cable 2030 may be electrically coupled to the pad 2016 via solder, electrically-conductive epoxy, or some combination thereof. The connector 2000 may electrically couple the cable 2030 to the pad 2004 of the IC package 2002. In particular, the cable 2030 may be electrically coupled to the pad 2004 via the elastomer element 2022, the trace 2010, the via 2020, and the pad 2016 of the connector 2000.

Figure 21:
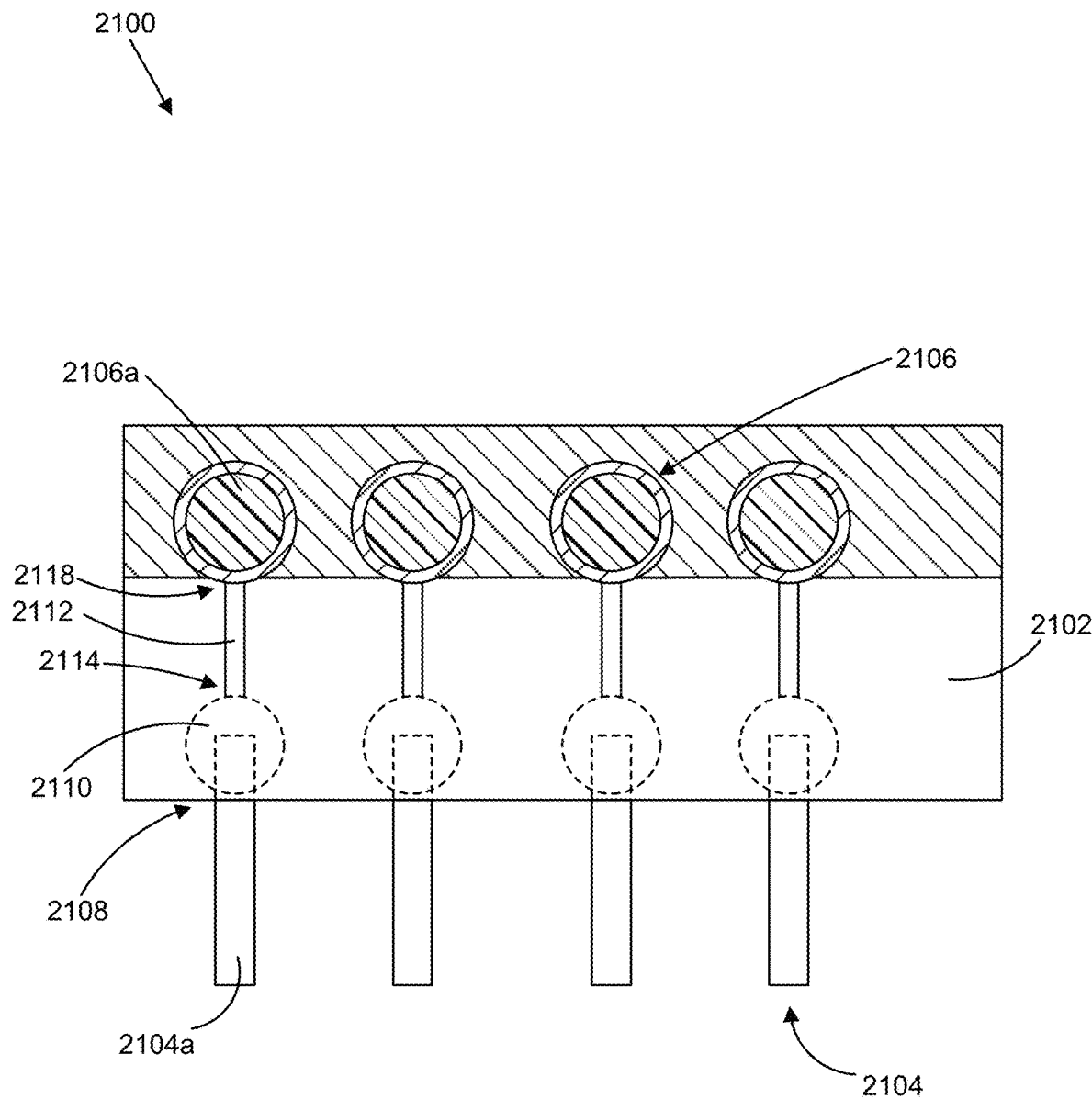
FIG. 21 illustrates a diagram of an example connector arrangement, according to various embodiments.

FIG. 21 illustrates a diagram of an example connector arrangement 2100, according to various embodiments. The connector arrangement 2100 may implement one or more of the connectors 1900 (FIG. 19) and/or the connectors 2000 (FIG. 20). For example, the connector arrangement 2100 may include a substrate 2102 (such as the substrate 1908 (FIG. 19) and/or the substrate 2008 (FIG. 20) that provides for coupling of one or more cables 2104 to one or more elastomer elements 2106, wherein each coupled cable 2104 and elastomer element 2106 may include one or more of the features of the connector 1900 and/or the connector 2000 that provide electrical coupling between the respective cables and elastomer elements.

In the illustrated embodiment, the connector arrangement 2100 includes four connectors implemented with the substrate 2102 of the connector arrangement 2100. It is to be understood that more or fewer connectors may be implemented with the substrate 2102 in other embodiments. For brevity, a first connector 2108 is described. It is to be understood that the first connector 2108 is representative of other connectors that may be implemented within the substrate 2102.

The first connector 2108 may include a portion of the substrate 2102. The first connector 2108 may include a pad 2110 located at a surface of the substrate 2102. In particular, the pad 2110 may be located at an opposite side of the substrate 2102 shown, as illustrated by the dotted lines showing the pad 2110.

The first connector 2108 may further include a trace 2112. The trace 2112 may include one or more of the features of the trace 1910 (FIG. 19) and/or the trace 2010 (FIG. 20). The trace 2112 may be electrically coupled to the pad 2110 toward a first end 2114 of the trace 2112. In some embodiments, the first connector 2108 may further include a via (such as the via 2020 (FIG. 20)) that electrically couples the trace 2112 to the pad 2110.

The first connector 2108 may further include an elastomer element 2106a. The elastomer element 2106a may include one or more of the features of the elastomer element 1914 (FIG. 19) and/or the elastomer element 2022 (FIG. 20). The elastomer element 2106a may be electrically coupled to the trace 2112 toward a second end 2118 of the trace 2112. In some embodiments, the first connector 2108 may further include one or more electrically-conductive sidewalls (such as the electrically-conductive sidewalls 2026 (FIG. 20)) that electrically couple the elastomer element 2106a to the trace 2112.

The connector arrangement 2100 may further include a first cable 2104a. The first cable 2104a may include one or more of the features of the cable 1920 (FIG. 19) and/or the cable 2030 (FIG. 20). The first cable 2104a may be electrically coupled to the pad 2110. The first cable 2104a may be electrically coupled to the pad 2110 via solder, electrically-conductive epoxy, or some combination thereof.

Figure 22:
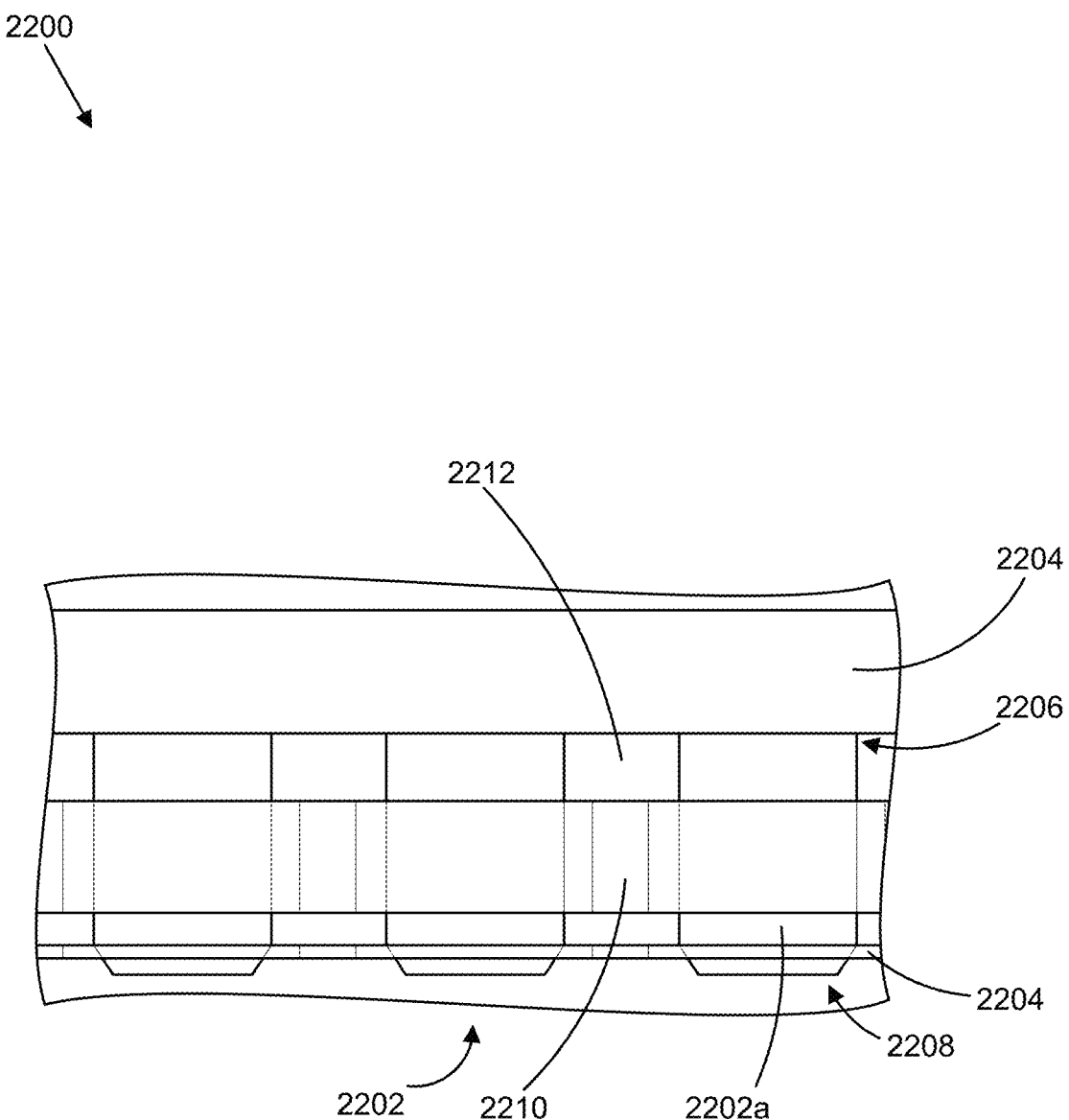
FIG. 22 illustrates a side view of an example connector arrangement, according to various embodiments.

FIG. 22 illustrates a side view of an example connector arrangement 2200, according to various embodiments. The connector arrangement 2200 may include one or more of the features of the connector arrangement 2100 (FIG. 21).

The connector arrangement 2200 may include one or more elastomer elements 2202. In the illustrated embodiment, the connector arrangement 2200 includes three elastomer elements 2202. The elastomer elements 2202 may comprise powder. The powder may comprise gold powder in some of the embodiments.

The connector arrangement 2200 may include film 2204. The film 2204 may be located at a first end 2206 of the first elastomer element 2202a, at a second end 2208 of the elastomer element 2202a, or at both. The film 2204 may comprise polyamide. The polyamide may include carbon, hydrogen, nitrogen, oxygen, or some combination thereof.

The connector arrangement 2200 may further include a substrate 2210. The substrate 2210 may comprise one or more build-up layers. The substrate 2210 may include one or more apertures through which the elastomer elements extend.

The connector arrangement 2200 may further include a silicone structure 2212. The silicone structure 2212 may comprise silicone. The silicone structure 2212 may be located between the elastomer elements 2202. The silicone structure 2212 may encompass a majority of the elastomer elements 2202.

Figure 23:
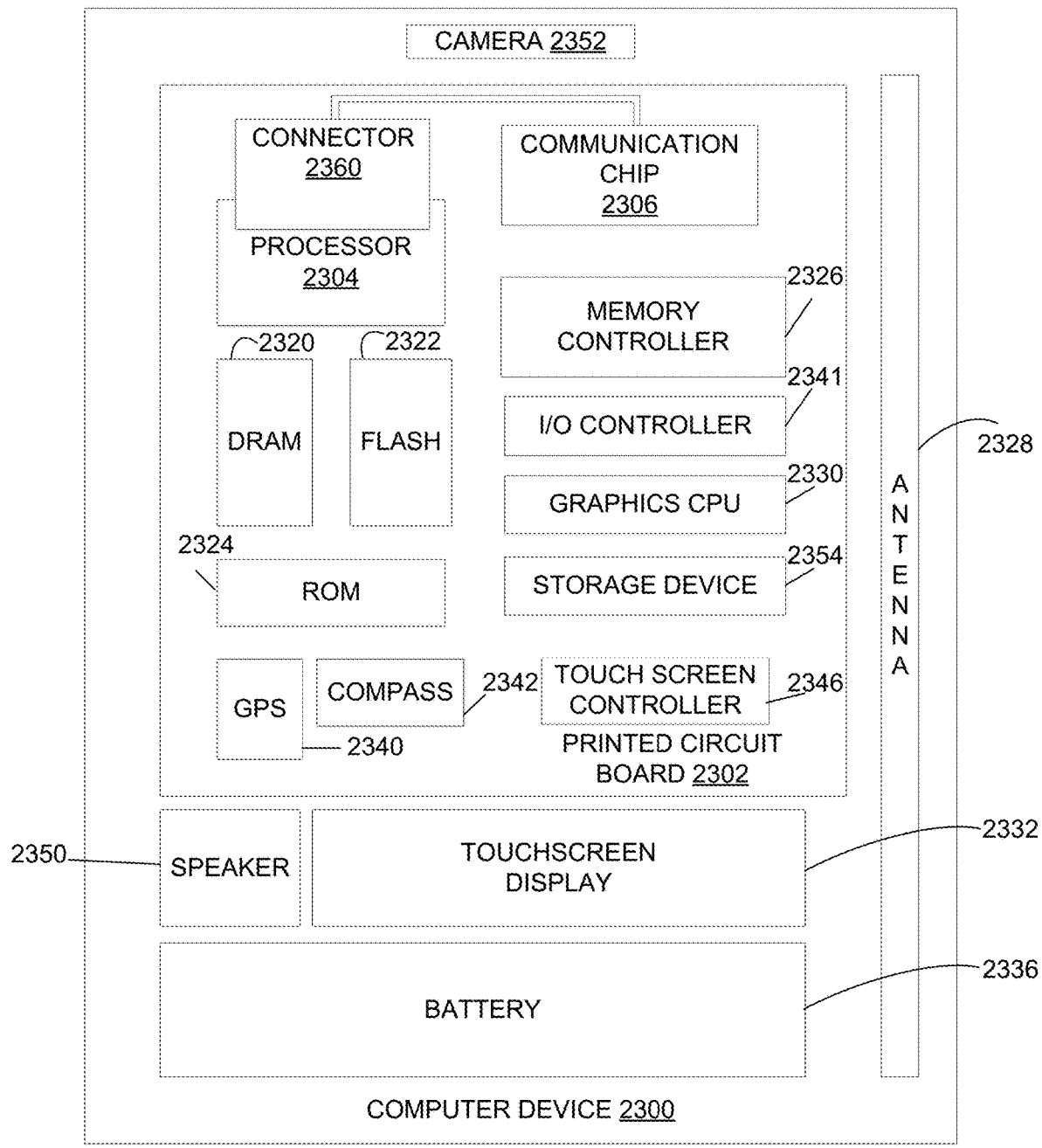
FIG. 23 illustrates an example computer device that may employ the apparatuses and/or methods described herein.

FIG. 23 illustrates an example computer device 2300 that may employ the apparatuses and/or methods described herein (e.g., connector 100, contact 200, connector 300, connector 400, contact 500, connector 700, connector 1200, contact 1400, connector 1500, contact arrangement 1700, contact arrangement 1800, connector 1900, connector 2000, contact arrangement 2100, and/or contact arrangement 2200), in accordance with various embodiments. As shown, computer device 2300 may include a number of components, such as one or more processor(s) 2304 (one shown) and at least one communication chip 2306. In various embodiments, the one or more processor(s) 2304 each may include one or more processor cores. In various embodiments, the at least one communication chip 2306 may be physically and electrically coupled to the one or more processor(s) 2304. In further implementations, the communication chip 2306 may be part of the one or more processor(s) 2304. In various embodiments, computer device 2300 may include printed circuit board (PCB) 2302. For these embodiments, the one or more processor(s) 2304 and communication chip 2306 may be disposed thereon. In alternate embodiments, the various components may be coupled without the employment of PCB 2302.

Depending on its applications, computer device 2300 may include other components that may or may not be physically and electrically coupled to the PCB 2302. These other components include, but are not limited to, memory controller 2326, volatile memory (e.g., dynamic random access memory (DRAM)) 2320, non-volatile memory such as read only memory (ROM) 2324, flash memory 2322, storage device 2354 (e.g., a hard-disk drive (HDD)), an I/O controller 2341, a digital signal processor (not shown), a crypto processor (not shown), a graphics processor 2330, one or more antenna 2328, a display (not shown), a touch screen display 2332, a touch screen controller 2346, a battery 2336, an audio codec (not shown), a video codec (not shown), a global positioning system (GPS) device 2340, a compass 2342, an accelerometer (not shown), a gyroscope (not shown), a speaker 2350, a camera 2352, and a mass storage device (such as hard disk drive, a solid state drive, compact disk (CD), digital versatile disk (DVD)) (not shown), and so forth.

In some embodiments, the one or more processor(s) 2304, flash memory 2322, and/or storage device 2354 may include associated firmware (not shown) storing programming instructions configured to enable computer device 2300, in response to execution of the programming instructions by one or more processor(s) 2304, to practice all or selected aspects of the methods described herein. In various embodiments, these aspects may additionally or alternatively be implemented using hardware separate from the one or more processor(s) 2304, flash memory 2322, or storage device 2354.

The computer device 2300 may further include a connector 2360. The connector 2360 may include one or more of the features of the connector 100 (FIG. 1), the contact 200 (FIG. 2), the connector 300 (FIG. 3), the connector 400 (FIG. 4), the contact 500 (FIG. 5), the connector 700 (FIG. 7), the connector 1200 (FIG. 12), the contact 1400 (FIG. 14), the connector 1500 (FIG. 15), the contact arrangement 1700 (FIG. 17), the contact arrangement 1800 (FIG. 18), the connector 1900 (FIG. 19), the connector 2000 (FIG. 20), the contact arrangement 2100 (FIG. 21), the contact arrangement 2200 (FIG. 22), or some combination thereof. In the illustrated embodiment, the connector 2360 is illustrated mated with the processor 2304. In particular, the connector 2360 may mate with one of the processor 2304. For example, the connector 2360 may mate with a diving board of the processor 2304. Further, the connector 2360 may couple the one of the processor 2304 to the communication chip 2306. It is to be understood that the connector 2360 may mate to a diving board of any of the other components within the computer device 2300 and may couple to any of the other components within the computer device 2300.

The communication chips 2306 may enable wired and/or wireless communications for the transfer of data to and from the computer device 2300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2306 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 2300 may include a plurality of communication chips 2306. For instance, a first communication chip 2306 may be dedicated to shorter range wireless communications such as Wi-Fi and Bluetooth, and a second communication chip 2306 may be dedicated to longer range wireless communications such as GPS, EDGE, GPRS, CDMA, WiMAX, LTE, Ev-DO, and others.

In various implementations, the computer device 2300 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 2300 may be any other electronic device that processes data.

Figure 24:
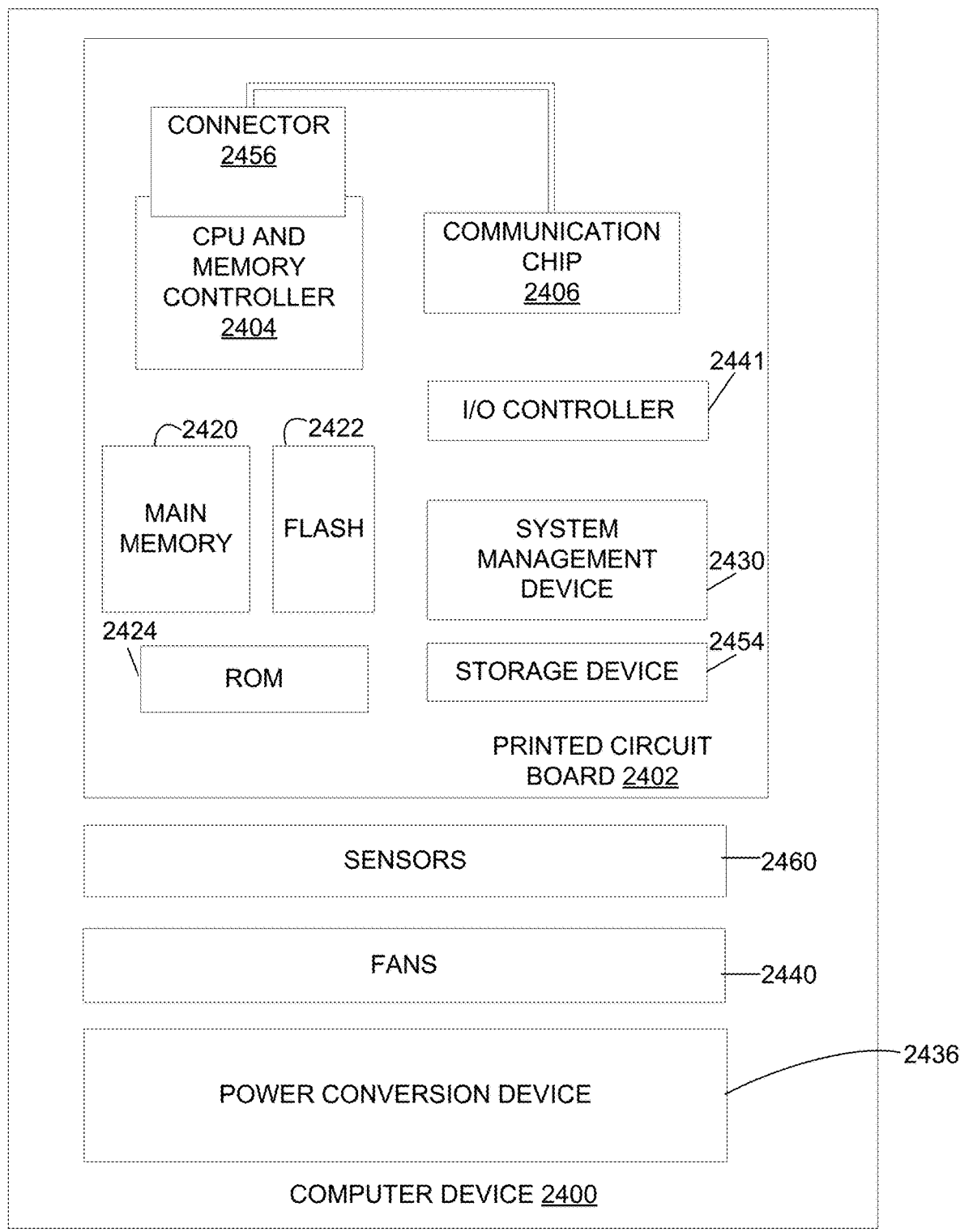
FIG. 24 illustrates another example computer device that may employ the apparatuses and/or methods described herein, in accordance with various embodiments.

FIG. 24 illustrates an example computer device 2400 that may employ the apparatuses and/or methods described herein (e.g., connector 100, contact 200, connector 300, connector 400, contact 500, connector 700, connector 1200, contact 1400, connector 1500, contact arrangement 1700, contact arrangement 1800, connector 1900, connector 2000, contact arrangement 2100, and/or contact arrangement 2200), in accordance with various embodiments. As shown, computer device 2400 may include a number of components, such as one or more processor and memory controller device(s) 2404 (one shown) and at least one communication chip 2406. In various embodiments, the one or more processor and memory controller device(s) 2404 each may include one or more processor cores. In various embodiments, the at least one communication chip 2406 may be physically and electrically coupled to the one or more processor and memory controller device(s) 2404. In further implementations, the communication chip 2406 may be part of the one or more processor and memory controller device(s) 2404.

Further, in various embodiments, a system management device 2430 (such as baseboard management controller (BMC)) may be coupled to the one or more processor and memory controller device(s) 2404. The system management device 2430 may monitor the state of the computer device 2400 via one or more sensors 2460. The one or more sensors 2460 may sense the physical state of the computer device 2400, such as a temperature of the computer device 2400. In some embodiments, the system management device 2430 may communicate with the one or more processor and memory controller device(s) 2404 through an independent connection. Further, in some embodiments, the system management device 2430 and/or the sensors 2460 may be omitted.

In various embodiments, computer device 2400 may include printed circuit board (PCB) 2402. For these embodiments, the one or more processor and memory controller device(s) 2404 and communication chip 2406 may be disposed thereon. In alternate embodiments, the various components may be coupled without the employment of PCB 2402. Depending on its applications, computer device 2400 may include other components that may or may not be physically and electrically coupled to the PCB 2402. These other components include, but are not limited to, main memory (e.g., volatile memory, non-volatile memory, and/or dynamic random access memory (DRAM)) 2420, read-only memory (ROM) 2424, flash memory 2422, storage device 2454 (e.g., a hard-disk drive (HDD)), an I/O controller 2441, a digital signal processor (not shown), a crypto processor (not shown), a system management device 2430, a display (not shown), a power conversion device 2436, an audio codec (not shown), a video codec (not shown), and a mass storage device (such as hard disk drive, a solid state drive, compact disk (CD), digital versatile disk (DVD)) (not shown), and so forth.

In various embodiments, the computer device 2400 may include one or more fans 2440. The one or more fans 2440 may be directed at and/or mounted to one or more of the components within the computer device 2400. In some embodiments, the one or more fans 2440 may be coupled to the one or more processor and memory controller device(s) 2404 and/or the system management device 2430, which may control operation of the one or more fans 2440.

In some embodiments, the one or more processor and memory controller device(s) 2404, flash memory 2422, and/or storage device 2454 may include associated firmware (not shown) storing programming instructions configured to enable computer device 2400, in response to execution of the programming instructions by one or more processor and memory controller device(s) 2404, to practice all or selected aspects of the methods described herein. In various embodiments, these aspects may additionally or alternatively be implemented using hardware separate from the one or more processor and memory controller device(s) 2404, flash memory 2422, or storage device 2454.

The computer device 2400 may further include a connector 2456. The connector 2456 may include one or more of the features of the connector 100 (FIG. 1), the contact 200 (FIG. 2), the connector 300 (FIG. 3), the connector 400 (FIG. 4), the contact 500 (FIG. 5), the connector 700 (FIG. 7), the connector 1200 (FIG. 12), the contact 1400 (FIG. 14), the connector 1500 (FIG. 15), the contact arrangement 1700 (FIG. 17), the contact arrangement 1800 (FIG. 18), the connector 1900 (FIG. 19), the connector 2000 (FIG. 20), the contact arrangement 2100 (FIG. 21), the contact arrangement 2200 (FIG. 22), or some combination thereof. In the illustrated embodiment, the connector 2456 is illustrated mated with the one or more processor and memory controller device(s) 2404. In particular, the connector 2456 may mate with one of the processor and memory controller device(s) 2404. For example, the connector 2456 may mate with a diving board of the one of the processor and memory controller device(s) 2404. Further, the connector 2456 may couple the one of the processor and memory controller device(s) 2404 to the communication chip 2406. It is to be understood that the connector 2456 may mate to a diving board of any of the other components within the computer device 2400 and may couple to any of the other components within the computer device 2400.

The communication chips 2406 may enable wired and/or wireless communications for the transfer of data to and from the computer device 2400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2406 may implement any of a number of wireless standards or protocols, including but not limited to IEEE 2402.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 2400 may include a plurality of communication chips 2406. For instance, a first communication chip 2406 may be dedicated to shorter range wireless communications such as Wi-Fi and Bluetooth, and a second communication chip 2406 may be dedicated to longer range wireless communications such as GPS, EDGE, GPRS, CDMA, WiMAX, LTE, Ev-DO, and others.

In various implementations, the computer device 2400 may be a server. In other implementations, the computer device 2400 may be, or components of the computer device 2400 may be implemented in, a laptop, a netbook, a notebook, an ultrabook, a smartphone, a computer tablet, a personal digital assistant (PDA), an ultra-mobile PC, a mobile phone, a desktop computer, a printer, a scanner, a monitor, a set-top box, an entertainment control unit (e.g., a gaming console or automotive entertainment unit), a digital camera, an appliance, a portable music player, or a digital video recorder. In further implementations, the computer device 2400 may be any other electronic device that processes data.

Example 1 may include a connector for mating with an integrated circuit (IC) package, comprising a housing with a recess to receive a portion of the IC package, and a contact coupled to the housing and that extends into the recess, wherein the contact includes a main body that extends from the housing into the recess, and a curved portion that extends from an end of the main body, wherein the curved portion loops back and contacts the main body.

Example 2 may include the connector of claim 1, wherein an end of the curved portion contacts the main body, wherein the end of the curved portion is located opposite from where the curved portion extends from the main body.

Example 3 may include the connector of claim 2, wherein the end of the curved portion is affixed to the main body via solder or electrically-conductive epoxy.

Example 4 may include the connector of claim 1, wherein the main body extends along a side of the recess, and wherein the curved portion loops back away from the side of the recess.

Example 5 may include the connector of claim 1, wherein the curved portion is to contact a pad of the IC package when the connector is mated with the IC package.

Example 6 may include the connector of claim 1, wherein the curved portion extends from the end of the main body at an angle to the main body.

Example 7 may include the connector of claim 1, wherein the curved portion extends from the end of the main body along a same plane as the main body.

Example 8 may include a computer device, comprising an integrated circuit (IC) package, and a connector mated to a portion of the IC package, wherein the connector includes a contact that contacts a pad of the IC package, and wherein the contact includes a main body, and a curved portion that extends from an end of the main body, wherein the curved portion loops back and contacts the main body.

Example 9 may include the computer device of claim 8, wherein the connector further includes a housing with a recess, wherein the portion of the IC package is located within the recess, and wherein the contact is coupled to the housing and extends into the recess.

Example 10 may include the computer device of claim 8, wherein an end of the curved portion contacts the main body, wherein the end of the curved portion is located opposite from where the curved portion extends from the main body.

Example 11 may include the computer device of claim 10, wherein the end of the curved portion is affixed to the main body via solder or electrically-conductive epoxy.

Example 12 may include the computer device of claim 8, wherein the curved portion contacts a pad of the IC package.

Example 13 may include the computer device of claim 8, wherein the portion of the IC package includes a diving board of the IC package.

Example 14 may include a connector for mating with an integrated circuit (IC) package, comprising a housing with a recess to receive a portion of the IC package, a contact coupled to the housing and that extends into the recess, and a retraction mechanism coupled to the housing, wherein the retraction mechanism causes the contact to be moved away from where the portion of the IC package is to be received when the retraction mechanism is actuated.

Example 15 may include the connector of claim 14, wherein the retraction mechanism includes a pretension element that contacts the contact when the retraction mechanism is actuated and applies a force to the contact that causes the contact to be moved away from where the portion of the IC package is to be received.

Example 16 may include the connector of claim 15, wherein the retraction mechanism further includes a cam mechanism coupled to the pretension element, wherein the cam mechanism controls actuation of the retraction mechanism.

Example 17 may include the connector of claim 15, wherein the pretension element translates along a side of the recess when the retraction mechanism is actuated.

Example 18 may include the connector of claim 14, wherein the contact extends along a side of the recess, and wherein the contact is moved toward the side of the recess when the retraction mechanism is actuated.

Example 19 may include the connector of claim 14, wherein the contact has a stub length of less than 0.3 millimeters.

Example 20 may include the connector of claim 14, wherein the housing includes a lip located along a side of the recess, and wherein the contact is to move behind the lip when the retraction mechanism is actuated.

Example 21 may include a computer device, comprising an integrated circuit (IC) package, and a connector mated to a portion of the IC package, wherein the connector includes a housing with a recess, wherein the portion of the IC package is located within the recess, a contact coupled to the housing and that contacts a pad of the portion of the IC package, and a retraction mechanism coupled to the housing, wherein the retraction mechanism causes the contact to be moved away from the pad when the retraction mechanism is actuated.

Example 22 may include the computer device of claim 21, wherein a pretension element contacts the contact when the retraction mechanism is actuated and applies a force to the contact that causes the contact to be moved away from the pad.

Example 23 may include the computer device of claim 22, wherein the retraction mechanism further includes a cam mechanism coupled to the pretension element, wherein the cam mechanism controls actuation of the retraction mechanism.

Example 24 may include the computer device of claim 22, wherein the contact and the pretension element are located along a side of the recess, and wherein the pretension element translates along the side of the recess when the retraction mechanism is actuated.

Example 25 may include the computer device of claim 21, wherein the contact extends along a side of the recess, and wherein the contact is moved toward the side of the recess when the retraction mechanism is actuated.

Example 26 may include the computer device of claim 21, wherein the housing includes a lip located along a side of the recess, wherein the portion of the IC package is located adjacent to a first side of the lip, and wherein the contact is to move behind a second side of the lip when the retraction mechanism is actuated.

Example 27 may include the computer device of claim 21, wherein the portion of the IC package includes a diving board of the IC package.

Example 28 may include a connector for mating with an integrated circuit (IC) package, comprising a housing with a recess to receive a portion of the IC package, and a contact coupled to the housing at a first end of the contact, wherein the contact includes an elastomer element located at a second end of the contact, the elastomer element to contact a pad of the portion of the IC package and electrically couple the contact to the pad.

Example 29 may include the connector of claim 28, wherein the elastomer element includes electrically-conductive metal fillers.

Example 30 may include the connector of claim 29, wherein the elastomer element is polymer-based.

Example 31 may include the connector of claim 28, wherein the elastomer element has a diameter of approximately 0.3 millimeters.

Example 32 may include the connector of claim 28, wherein the housing includes a clamp portion, wherein the clamp portion is to apply force to the contact that causes the contact to translate in a direction substantially perpendicular to the pad.

Example 33 may include the connector of claim 28, wherein elastomer element is affixed at the second end of the contact via insert mold or solder.

Example 34 may include the connector of claim 28, further comprising an alignment mechanism coupled to the contact, wherein the alignment mechanism is utilized to align the elastomer element with the pad.

Example 35 may include the connector of claim 34, wherein the alignment mechanism includes an insert mold coupled to the contact, and an alignment pin coupled to the insert mold, the alignment pin to engage with a guide located adjacent to a surface of the IC package, the guide to align the elastomer element with the pad.

Example 36 may include a computer device, comprising an integrated (IC) package, and a connector mated to a portion of the IC package, wherein the connector includes a contact coupled to the housing at a first end of the contact, wherein the contact includes an elastomer element located at a second end of the contact, and wherein the elastomer element contacts a pad of the portion of the IC package and electrically couples the contact to the pad.

Example 37 may include the computer device of claim 36, wherein the elastomer element is polymer-based and includes electrically-conductive metal fillers.

Example 38 may include the computer device of claim 36, wherein a footprint of the elastomer element and a footprint of the pad are approximately a same size and a same shape.

Example 39 may include the computer device of claim 38, wherein the elastomer element and the pad have diameters of approximately 0.3 millimeters.

Example 40 may include the computer device of claim 36, wherein the connector further includes a clamp portion, wherein the clamp portion is to apply force to the contact that causes the contact to translate in a direction substantially perpendicular to the pad.

Example 41 may include the computer device of claim 36, further comprising a guide located adjacent to a surface of the IC package at which the pad is located, wherein the guide has an aperture that is aligned with the pad, and wherein the elastomer element extends through the aperture to contact the pad.

Example 42 may include the computer device of claim 41, wherein the guide includes a substrate formed of one or more build-up layers.

Example 43 may include the computer device of claim 41, wherein the guide further includes a substrate located adjacent to the surface of the IC package and one or more connector pins coupled to the substrate and the IC package, wherein the connector pins offset the substrate from the surface.

Example 44 may include the computer device of claim 43, wherein the connector further includes an alignment pin coupled to the contact, wherein the alignment pin extends into a recess of the substrate to align the elastomer element with the pad.

Example 45 may include the computer device of claim 44, wherein the alignment pin is coupled to the contact via an insert mold.

Example 46 may include the computer device of claim 36, wherein the portion of the IC package includes a diving board of the IC package.

Example 47 may include a connector for coupling to an integrated circuit (IC) package, comprising a substrate, a trace affixed to the substrate, wherein the trace is to couple to a cable, and an elastomer element coupled to the trace, the elastomer element to contact a pad of the IC package and electrically couple the cable to the pad via the trace.

Example 48 may include the connector of claim 47, wherein the elastomer element has a diameter of approximately 0.3 millimeters.

Example 49 may include the connector of claim 47, wherein the substrate includes one or more build-up layers.

Example 50 may include the connector of claim 47, wherein the trace extends along a surface of the substrate.

Example 51 may include the connector of claim 50, the elastomer element is coupled to the trace on an opposite side of the trace from the surface of the substrate, and wherein the cable is to couple to the trace on the opposite side of the trace from the surface of the substrate.

Example 52 may include the connector of claim 47, wherein the trace extends within the substrate between a first portion and a second portion of the substrate, wherein the connector further comprises a pad of the connector, wherein the pad of the connector is located at a surface of the substrate and is to couple to the cable, and a via located within the substrate, wherein the via couples the pad of the connector with the trace.

Example 53 may include the connector of claim 52, wherein the elastomer element extends into the first portion of the substrate.

Example 54 may include a computer device, comprising an integrated (IC) package, a cable, and a connector that electrically couples a pad of the IC package and the cable, wherein the connector includes a substrate, a trace affixed to the substrate and coupled to the cable, and an elastomer element coupled to the trace and in contact with the pad, wherein the elastomer element electrically couples the pad to the cable via the trace.

Example 55 may include the computer device of claim 54, further comprising a mounting mechanism, wherein the mounting mechanism applies a force to the connector and presses the elastomer element against the pad.

Example 56 may include the computer device of claim 54, wherein the trace extends along a surface of the substrate, and wherein the elastomer element is coupled to the trace on an opposite side of the trace from the surface of the substrate.

Example 57 may include the computer device of claim 54, wherein a footprint of the elastomer element and a footprint of the pad are approximately a same size and a same shape.

Example 58 may include the computer device of claim 57, wherein the elastomer element and the pad have diameters of approximately 0.3 millimeters.

Example 59 may include the computer device of claim 54, wherein the trace extends within the substrate between a first portion and a second portion of the substrate, wherein the connector further comprises a pad of the connector, wherein the pad of the connector is located at a surface of the substrate and is coupled to the cable, and a via located within the substrate, wherein the via couples the pad of the connector with the trace.

Example 60 may include the computer device of claim 59, wherein the first portion of the substrate includes a first set of build-up layers, and wherein the second portion of the substrate includes a second set of build-up layers.

Example 61 may include the computer device of claim 54, wherein the cable is a Twinax cable.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A connector for mating with an integrated circuit (IC) package, comprising:
 a housing with a recess to receive a portion of the IC package; and
 a contact coupled to the housing and that extends into the recess, wherein the contact includes:
  a main body that extends from the housing into the recess, wherein the main body includes a first edge and a second edge disposed opposite the first edge, a first side that is directed toward a center of the recess, and a second side disposed opposite the first side and is directed toward a side of the recess; and
  a curved portion that extends from an end of the main body toward the first edge of the body, and loops back away from the first edge and toward the second edge of the body, and contacts the main body, wherein the curved portion includes a guide portion that is located on the first side of the body, and extends from an end of the main body and slants back toward the main body, to guide the portion of the IC package into the recess.

2. The connector of claim 1, wherein an end of the curved portion contacts the main body, wherein the end of the curved portion is located opposite from where the curved portion extends from the main body.

3. The connector of claim 2, wherein the end of the curved portion is affixed to the main body via solder or electrically-conductive epoxy.

4. The connector of claim 1, wherein the main body extends along a side of the recess, and wherein the curved portion loops back away from the side of the recess.

5. The connector of claim 1, wherein the curved portion is to contact a pad of the IC package when the connector is mated with the IC package.

6. The connector of claim 1, wherein the curved portion extends from the end of the main body at an angle to the main body.

7. The connector of claim 1, wherein the curved portion extends from the end of the main body along a same plane as the main body.

8. A computer device, comprising:
 an integrated circuit (IC) package; and
 a connector mated to a portion of the IC package, wherein the connector includes a contact that contacts a pad of the IC package, and wherein the contact includes:
  a main body, wherein the main body includes a first edge and a second edge disposed opposite the first edge, a first side that is directed toward a center of a recess, and a second side disposed opposite the first side and is directed toward a side of the recess; and
  a curved portion that extends from an end of the main body, toward the first edge of the body, and loops back away from the first edge and toward the second edge of the body, loops back and contacts the main body, wherein the curved portion includes a guide portion that is located on the first side of the body, and extends from an end of the main body and slants back toward the main body, to guide the portion of the IC package into the recess.

9. The computer device of claim 8, wherein the connector further includes a housing with a recess, wherein the portion of the IC package is located within the recess, and wherein the contact is coupled to the housing and extends into the recess.

10. The computer device of claim 8, wherein an end of the curved portion contacts the main body, wherein the end of the curved portion is located opposite from where the curved portion extends from the main body.

11. The computer device of claim 10, wherein the end of the curved portion is affixed to the main body via solder or electrically-conductive epoxy.

12. The computer device of claim 8, wherein the curved portion contacts a pad of the IC package.

13. The computer device of claim 8, wherein the portion of the IC package includes a diving board of the IC package.

14. A connector for mating with an integrated circuit (IC) package, comprising:
 a housing with a recess to receive a portion of the IC package;
 a contact coupled to the housing and that extends into the recess, wherein the contact includes:
  a main body that extends from the housing into the recess, wherein the main body includes a first edge and a second edge disposed opposite the first edge, a first side that is directed toward a center of the recess, and a second side disposed opposite the first side and is directed toward a side of the recess; and
  a curved portion that extends from an end of the main body toward the first edge of the body, and loops back away from the first edge and toward the second edge of the body, and contacts the main body, wherein the curved portion includes a guide portion that is located on the first side of the body, and extends from an end of the main body and slants back toward the main body, to guide the portion of the IC package into the recess; and
 a retraction mechanism coupled to the housing, wherein the retraction mechanism causes the contact to be moved away from where the portion of the IC package is to be received when the retraction mechanism is actuated.

15. The connector of claim 14, wherein the retraction mechanism includes a pretension element that contacts the contact when the retraction mechanism is actuated and applies a force to the contact that causes the contact to be moved away from where the portion of the IC package is to be received.

16. The connector of claim 15, wherein the retraction mechanism further includes a cam mechanism coupled to the pretension element, wherein the cam mechanism controls actuation of the retraction mechanism.

17. The connector of claim 15, wherein the pretension element translates along a side of the recess when the retraction mechanism is actuated.

18. The connector of claim 14, wherein the contact extends along a side of the recess, and wherein the contact is moved toward the side of the recess when the retraction mechanism is actuated.

19. The connector of claim 14, wherein the contact has a stub length of less than 0.3 millimeters.

20. The connector of claim 14, wherein the housing includes a lip located along a side of the recess, and wherein the contact is to move behind the lip when the retraction mechanism is actuated.

21. A computer device, comprising:
 an integrated circuit (IC) package; and
 a connector mated to a portion of the IC package, wherein the connector includes:

a housing with a recess, wherein the portion of the IC package is located within the recess;

a contact coupled to the housing and that contacts a pad of the portion of the IC package, wherein the contact includes:

a main body that extends from the housing into the recess, wherein the main body includes a first edge and a second edge disposed opposite the first edge, a first side that is directed toward a center of the recess, and a second side disposed opposite the first side and is directed toward a side of the recess; and a curved portion that extends from an end of the main body toward the first edge of the body, and loops back away from the first edge and toward the second edge of the body, and contacts the main body, wherein the curved portion includes a guide portion that is located on the first side of the body, and extends from an end of the main body and slants back toward the main body, to guide the portion of the IC package into the recess; and a retraction mechanism coupled to the housing, wherein the retraction mechanism causes the contact to be moved away from the pad when the retraction mechanism is actuated.

22. The computer device of claim 21, wherein a pretension element contacts the contact when the retraction mechanism is actuated and applies a force to the contact that causes the contact to be moved away from the pad.

23. The computer device of claim 22, wherein the retraction mechanism further includes a cam mechanism coupled to the pretension element, wherein the cam mechanism controls actuation of the retraction mechanism.

24. The computer device of claim 22, wherein the contact and the pretension element are located along a side of the recess, and wherein the pretension element translates along the side of the recess when the retraction mechanism is actuated.

25. The computer device of claim 21, wherein the contact extends along a side of the recess, and wherein the contact is moved toward the side of the recess when the retraction mechanism is actuated.

* * * * *